United States Patent [19]
Wojnarowski et al.

[11] Patent Number: 5,391,516
[45] Date of Patent: Feb. 21, 1995

[54] METHOD FOR ENHANCEMENT OF SEMICONDUCTOR DEVICE CONTACT PADS

[75] Inventors: Robert J. Wojnarowski, Ballston Lake; Bernard Gorowitz, Clifton Park, both of N.Y.

[73] Assignee: Martin Marietta Corp., King of Prussia, Pa.

[21] Appl. No.: 774,427

[22] Filed: Oct. 10, 1991

[51] Int. Cl.$^6$ .................. H01L 21/268; H01L 21/441; H01L 21/311
[52] U.S. Cl. ...................... 437/174; 437/173; 437/195; 437/229; 437/923; 437/947
[58] Field of Search .............. 437/923, 245, 183, 229, 437/192, 195, 173, 246, 174, 947; 148/DIG. 93

[56] References Cited

U.S. PATENT DOCUMENTS

| | | | |
|---|---|---|---|
| 4,067,104 | 1/1978 | Tracy | 437/183 X |
| 4,087,314 | 5/1978 | George et al. | 437/183 |
| 4,229,232 | 10/1980 | Kirkpatrick | 437/174 |
| 4,259,367 | 3/1981 | Dougherty, Jr. | 437/923 X |
| 4,510,674 | 4/1985 | Izu et al. | 437/923 X |
| 4,962,061 | 10/1990 | Takata | 437/195 |
| 5,182,231 | 1/1993 | Hongo et al. | 437/174 X |
| 5,187,119 | 2/1993 | Cech et al. | 437/195 X |
| 5,288,664 | 2/1994 | Mukai | 437/194 |

FOREIGN PATENT DOCUMENTS 150847 7/1987 Japan .................. 437/923

*Primary Examiner*—John S. Maples
*Attorney, Agent, or Firm*—Geoffrey H. Krauss

[57] ABSTRACT

Semiconductor device contact pads are enhanced by forming a metal plate over at least a portion of the contact pad. "Enhancement" includes repair such as by bridging a reinforcing pad area over probe damage, general reinforcement or enlargement of a contact pad, and placement of a protective buffer pad over a contact pad. These methods are applicable to any semiconductor device with contact pads on a surface thereof, such as entire wafers, individual dice, and multi-chip High Density Interconnect (HDI) modules. The pad enhancement plate is formed by applying a planarizing dielectric layer over the entire device (if not already formed in the initial stages of HDI processing), and an enhancement access via is then formed to expose a portion of the contact pad to be enhanced. The entire device is metallized, and metal not over the exposed portion of the contact pad is subsequently removed. Localized heating of the metal plate can be achieved by a laser to effectuate a selective pseudo-weld or produce sintering for a low resistance ohmic contact.

11 Claims, 19 Drawing Sheets

METHOD FOR ENHANCEMENT OF SEMICONDUCTOR DEVICE CONTACT PADS

BACKGROUND OF THE INVENTION

This invention relates generally to enhancement of semiconductor device contact pad surfaces for reliability improvement and other purposes and, more particularly, to repairing probe-damaged pads, reinforcing semiconductor pads in general, enlarging semiconductor device pads for various purposes, and buffering semiconductor device pads. The invention is applicable to any semiconductor device with contact pads on a surface thereof, such as, but not limited to, entire semiconductor wafers, including wafer scale integration (WSI) devices, individual semiconductor dice, and High Density Interconnect (HDI) multi-chip semiconductor device modules, such as disclosed in Eichelberger et al. U.S. Pat. No. 4,783,695, and related patents such as are identified hereinbelow.

Semiconductor devices, such as integrated circuit chips, typically have contact pads on a major surface. In conventional packaging technology, electrical connections to these contact pads are made by ultrasonic wire bonding. As part of the device manufacturing process, the contact pads are probed for electrical testing. In some situations, semiconductor device pads are probed a number of times, for various desired parameters. Such electrical probing results in varying degrees of probe damage to the pads, and in some cases multiple areas of damage to a single pad occur. The probing can leave areas of a pad literally detached from the underlying substrate.

In addition to probe damage, the various processing steps performed in pad etching can cause voids in the metal pads if not done carefully, leading to weakened areas.

One particular reliability problem occurs where forming of a via in an HDI module by laser dithering, such as described in Eichelberger et al. U.S. Pat. No. 4,894,115, may actually cause a local meltback of the pad, lifting a portion of the pad off of the semiconductor material. The lifted portion of the pad thus has a severely reduced conductive path for dissipating the laser energy heat generated during the laser drilling process. If processing were to continue, it would likely result in an electrical open circuit, or discontinuity, between the subsequently-applied via metallization and the pad. Although this condition is detectable by visual inspection, its repair is costly, as the standard repair procedure involves total removal of the adhesive overlying the pad and the dielectric film atop the adhesive, both of which are employed in typical HDI modules, along with replacement of the damaged semiconductor device.

Another particular reliability problem may occur when the HDI assembly process reaches the point of via metallization in ohmic contact with what remains of the contact pad. However, due to the thinned area of the pad which the via metallization actually contacts, current density could be many times the theoretically allowed limits, causing a later electrical open circuit or discontinuity as a result of a slow electromigration or a direct burnout under surge conditions. Such failures are more likely in high radiation environments.

Temperature constraints are typically placed on processes for repair of such damaged pads. Metal application methods, such as those used in large scale integration (LSI) or very large scale integration (VLSI) are not directly applicable. Generally, a post anneal at a temperature of approximately 400° C. is necessary to achieve ohmic contact and low resistivity. This temperature is objectionable for at least two reasons. First, in the event the semiconductor device is included in an HDI circuit module in the process of being assembled, such high temperature would destroy the polymer layers. Second, the fact that the damaged areas of the pads are probe damaged implies that the semiconductor device has passed its functional and parametric tests. Reheating the semiconductor device to such high temperature would necessitate retesting.

While the discussion up to this point has been primarily in the context of contact pad repair, which is one form of what is herein termed "enhancement", there are a variety of situations where it may be desired to enhance a semiconductor device contact pad in some other manner. For example, it may be desired to generally reinforce a contact pad, even in the absence of known damage. It may be desired to enlarge a contact pad, such as for the purpose of facilitating test probing. It may be desired to add a buffer pad for connection to a temporary wire bond for testing purposes and that may be pulled off when testing has been completed. Such operations have heretofore usually resulted in irreparably damaging a semiconductor device pad.

SUMMARY OF THE INVENTION

Accordingly, one object of the invention is to provide a general purpose method of semiconductor device contact pad repair, applicable to a wide variety of situations.

Another object of the invention is to provide a semiconductor device contact pad repair method which does not involve use of excessively high temperatures.

Another object of the invention is to prevent a semiconductor device failure due to high current density that leads to an open circuit condition by electromigration or other process in an area where a via contacts a damaged pad area.

Another object of the invention is to enable reliable use of probe-damaged, small die pads, such as 2 mils square, in the HDI process.

Another object of the invention is to provide a method for in situ repair of damaged semiconductor pads (or pads in process) experiencing a processing defect.

Another object of the invention is to provide a method for placing a protective pad over an existing semiconductor pad for buffering purposes.

Another object of the invention is to provide methods for repairing or reinforcing contact pad areas at the die or individual IC chip level, the HDI level, and the wafer level.

Another object of the invention is to provide a method for placing a buffer pad which may be wire bonded, over an existing pad on a semiconductor device, with the bond capable of being pulled out after testing without destroying the device.

Another object is to provide a buffer pad metal that can be chemically dissolved off from a chip, freeing the chip after test for repackaging without die pad damage.

Another object is to expand or enlarge a small (or a VLSI) circuit node to a size that can be probed normally with conventional technology.

Another object is to provide a method of locally inducing on one or more repaired semiconductor chip pads the effects of high temperature sintering to produce low ohmic contact, while all other areas remain at nearly room temperature.

The present invention provides a generic method of semiconductor device contact pad enhancement, including repair, applicable to a wide variety of situations.

In accordance with an overall aspect of the invention, a method for enhancing a contact pad on a semiconductor device comprises metallizing a surface of the contact pad to form a metal plate over at least a portion of the contact pad surface. Where necessary to reduce contact resistance between the metal plate and the contact pad, a laser is employed for selectively heating the metal plate to effectively achieve localized heating to effectuate resistance-lowering weld sintering.

The method of "enhancing" a contact pad hereof may comprise repairing a damaged or defective contact pad, which may be identified and located in a preliminary step of inspecting the semiconductor device. Alternatively, the method of "enhancing" the contact pad may comprise reinforcing the contact pad, enlarging the contact pad, or placing a protective buffer pad, which may be removable, over the contact pad.

In one particular embodiment of the invention, a method for enhancing a contact pad on a surface of a semiconductor device includes an initial step of applying a planarizing dielectric layer over the semiconductor device surface. A related method involves enhancing a contact pad on a surface of a semiconductor device that already has a polymer film overlying the surface, such as a device in the process of being assembled into an HDI circuit assembly. In either instance, an enhancement access via is formed in the dielectric or polymer film to expose a portion of the contact pad to be enhanced. The enhancement access via is larger than the damaged area, and may be larger than the contact pad itself. Preferably, the enhancement access via is wider at the top than at the bottom, and may be formed by employing a laser to ablate the dielectric or polymer material.

Next, a metallizing step is performed to apply metal over the dielectric or polymer layer and over the portion of the contact pad exposed by the enhancement access via. A mask is formed to protect the metal over the portion of the contact pad. The mask may be formed by applying resist over the applied metal, and then patterning the resist. The metal is then removed except where protected by the mask to leave a metal plate over the portion of the contact pad. Thereafter, the mask is removed.

As a further step, the enhancement access via may be backfilled with dielectric material or polymer material. In the case of an integrated circuit being assembled into an HDI module, HDI processing then continues normally.

In one alternative embodiment, the above step of forming a mask may include protecting at least one additional metal area over the dielectric layer. The subsequent step of removing the metal then leaves at least one additional metal area for ground plane or other desired purposes.

In another particular embodiment of the invention, a method for enhancing a contact pad on a surface of a semiconductor device comprises applying a layer of resist material over the semiconductor device surface and over the pad, and then forming in the layer of resist material an enhancement access via of re-entrant hole shape which is wider at the bottom than at the top to expose a region of the contact pad including a portion of the contact pad to be enhanced. The layer of resist material may, for example, comprise a photoresist, a polymer or an appropriate multi-layer structure including these materials.

By a metallizing step such as evaporating, metal is applied over the layer of resist material and over the portion of the contact pad to be enhanced, while leaving a discontinuity at the bottom of the enhancement access via between the metal over the layer of resist material and the metal over the portion of the contact pad to be enhanced. This discontinuity is facilitated by the re-entrant hole shape whereby the narrower top in effect forms an overhang shielding an annular portion of the exposed region of the contact pad from the metallization, which is essentially a line-of-sight process. Then, at least the metal over the layer of resist material is removed, while leaving the metal over the portion of the contact pad to be enhanced.

One particular way of forming an enhancement access via of re-entrant hole shape comprises depositing a metal mask layer over the layer of resist material, forming an opening in the metal mask layer, and then plasma etching to etch the resist material so that the metal mask opening overhangs the opening in the resist.

Another particular way of forming an enhancement access via of re-entrant hole shape, applicable when the layer of resist material is a photoresist, involves employing a laser to selectively expose a photoresist material where the enhancement access via is to be located, and then developing (dissolving) the photoresist.

Yet another particular way of forming an enhancement access via of re-entrant hole shape comprises a hybrid approach which may be employed when the layer of resist material comprises layers of dissimilar polymers, or a polymer in combination with an organic film. A laser is employed to pre-etch the resist material by ablation where the enhancement access via is to be formed. Then plasma etching is done to define the re-entrant hole shape.

The invention provides two alternatives for the step of removing at least the metal over the layer of resist material, while leaving the metal over the portion of the contact pad. As the first alternative, resist is applied, and then patterned to protect the metal over the portion of the contact pad. An etching step is next performed to remove first the metal over the layer of resist material and then the resist over the portion of the contact pad.

The second alternative involves a "float off" technique, wherein the layer of resist material is dissolved, allowing the metal over the layer of resist material, including, if applicable, a metal mask layer, to "float off". The discontinuity between the metal of the layer of resist material and the metal over the portion of the contact pad to be enhanced allows undermining of the metal whereby the resist material may be directly attacked.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE PREFERRED EMBODIMENT

Figure 1:
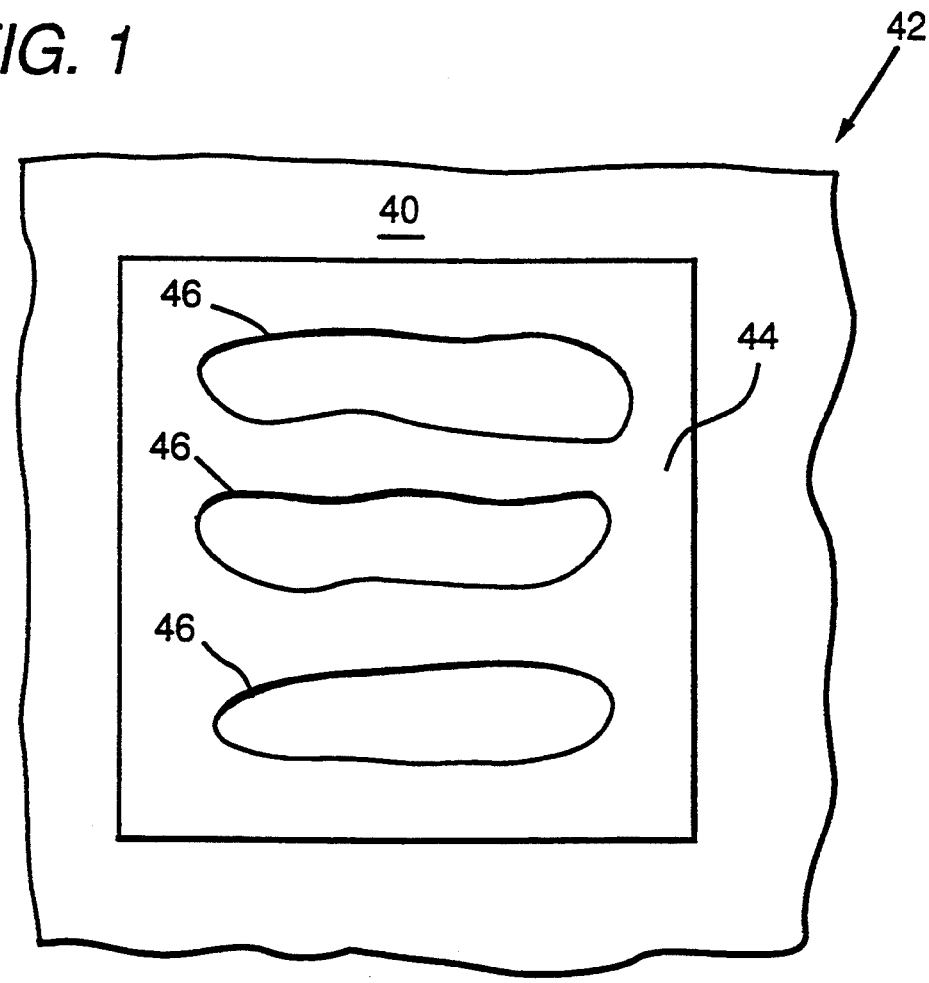
FIG. 1 is a top view depiction of a bonding pad with multiple areas of probe damage.

FIG. 1 depicts, in plan view, an upper surface 40 of a semiconductor device 42, and a contact pad 44 on the upper surface. By way of example, semiconductor device 42 comprises a silicon substrate and insulating oxide, and contact pad 44 is comprised of aluminum. A typical contact pad 44 is four mils by four mils square, and one micron thick. Contact pad 44 of FIG. 1 has been probed several times, and has several areas 46 of probe damage.

It will be appreciated that the FIG. 1 semiconductor device 42 is illustrative. Thus, semiconductor device 42 may range from being a single, relatively small, integrated circuit (IC) chip or die, to an entire semiconductor wafer, or to various wafer scale integration (WSI) device assemblies. In addition, semiconductor device 42 may comprise a single chip in an HDI assembly comprising many closely spaced and interconnected chips on a single two-inch square substrate.

The invention described herein is equally applicable to semiconductor devices which are to be packaged in a conventional manner, to semiconductor devices to be assembled in accordance with HDI technology or in the process of being so assembled, and to semiconductor devices which are to be packaged in other ways. Thus device 42 is representative of virtually any semiconductor device with contact pads on a surface thereof.

Figure 2:
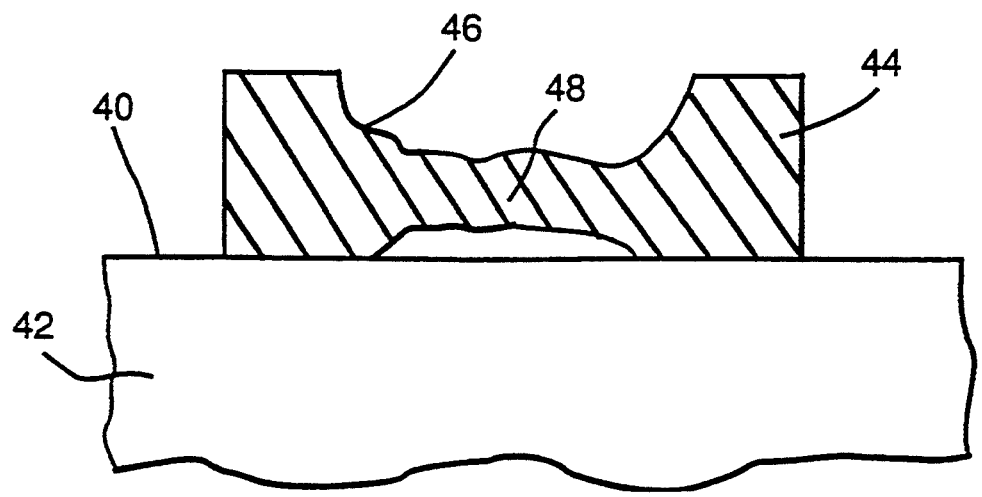
FIG. 2 depicts in cross section a bonding pad damaged by probing, including a lifted metal pad area not connected thermally to the underlying silicon.

FIG. 2 depicts such typical probe damage 46 in cross section. (It will be appreciated that FIG. 2 is not to scale.) Also evident in FIG. 2 is a portion 48 of contact pad 44 which is detached from the underlying silicon surface 40.

Figure 3:
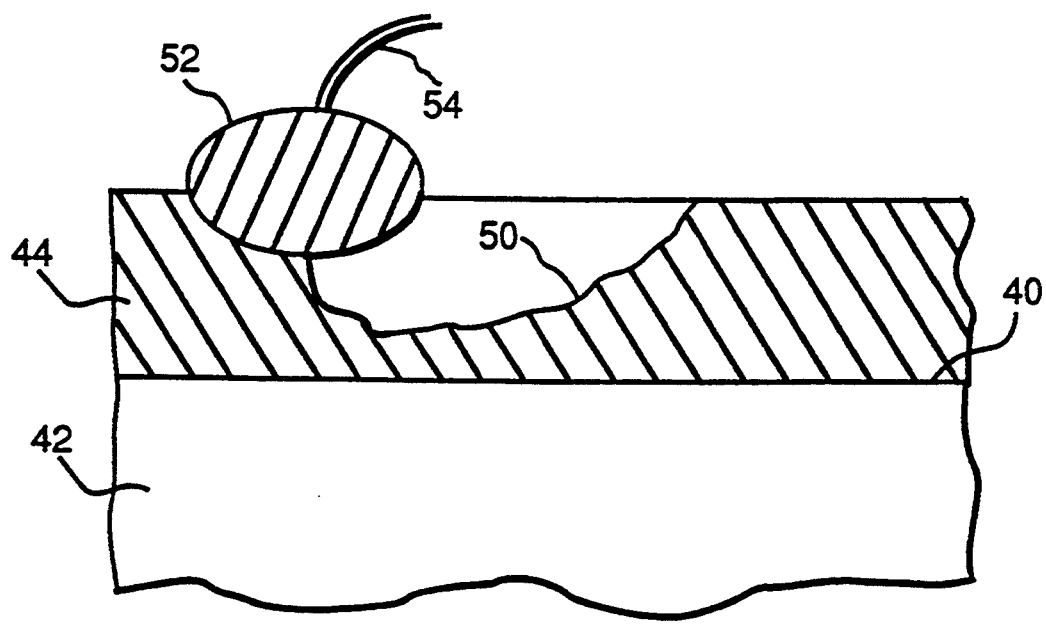
FIG. 3 depicts in cross section a gold ball bond to a semiconductor pad.

Heretofore, attempts at minimizing the adverse effects of such probe damage have been made by employing large areas of gold ball bonding interconnects or stitch interconnects to essentially bridge over weakened areas, electrically and mechanically strengthening the desired pad region. FIG. 3 illustrates a probe damaged area 50, with a gold ball 52 bonded to pad 44 and attached to a suitable lead 54. However, gold ball bonds are not acceptable in a radiation environment, nor are they consistent with HDI technology. More particularly, in the HDI structure disclosed in Eichelberger et al. U.S. Pat. No. 4,783,695, an electronic system which incorporates many integrated circuit (IC) chips and other components can be fully assembled and interconnected on a single substrate which is two inches square, and 0.050 inch thick. In the manufacture of such systems, the upper contact pad bearing surfaces of the various chips are disposed in substantially a common plane. An HDI overcoat is built up, starting with an adhesively attached dielectric film. Preferably, the dielectric film is a polyimide film such as KAPTON ®, typically one mil thick, available from E. I. du Pont de Nemours and Company, Wilmington, Del. A thermoplastic adhesive layer bonds the KAPTON film to the chips. The thermoplastic adhesive layer is preferably a polyetherimide resin available under the trademark ULTEM ® from General Electric Company, Pittsfield, Mass. and typically is deposited in a layer six to twelve microns in thickness.

In this HDI structure, via holes are laser drilled in the KAPTON and ULTEM layers in alignment with the contact pads on the chips to which it is desired to make contact. A patterned metallization layer is formed over the KAPTON layer, extending into the via holes to make electrical contact with the contact pads. The via holes are required to be relatively small, approximately one mil square in area.

Figure 4:
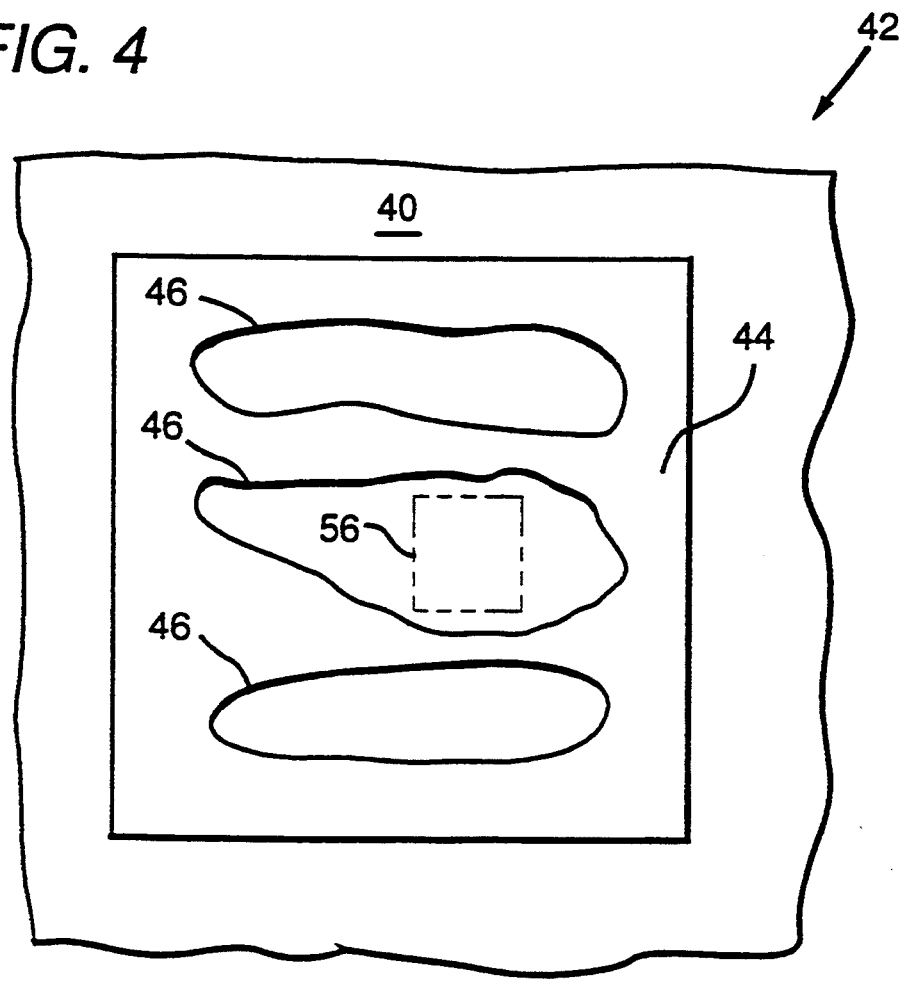
FIG. 4 is a top view depiction of the location of a via hole formed by laser drilling located within an area of probe damage.
Figure 5:
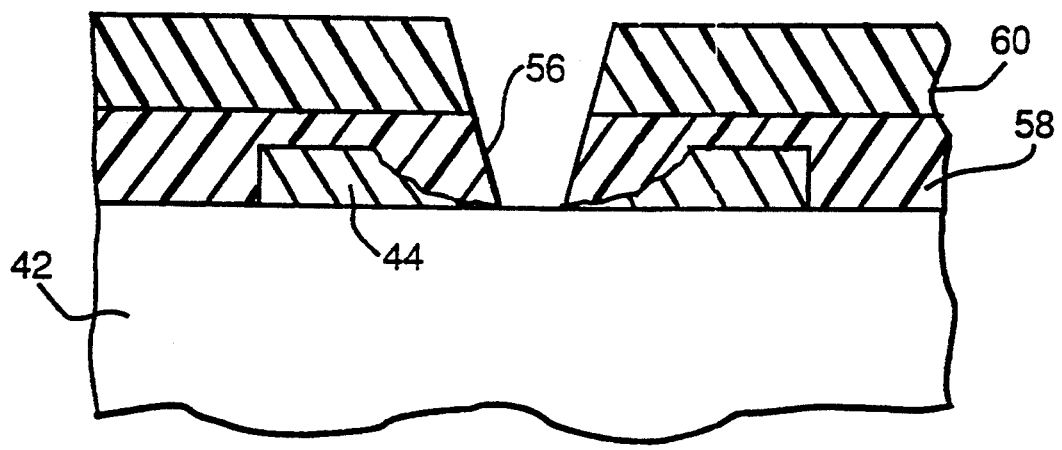
FIG. 5 depicts in cross section the via of FIG. 4.

FIGS. 4 and 5 illustrate how the relatively small via hole sizes in HDI technology exacerbate the problem of probe damage and other defects in semiconductor contact pads. Thus, FIG. 4 is similar to FIG. 1, but additionally shows the location of a via 56. FIG. 5 illustrates via 56 in cross section. FIG. 5 additionally depicts an ULTEM adhesive layer 58 and a KAPTON dielectric film layer 60 overlying semiconductor device 42 in accordance with the HDI technique. (It will again be appreciated that FIG. 5 is not to scale, inasmuch as KAPTON film layer 60 is much thicker than ULTEM adhesive layer 58, and contact pad 44 is much wider than it is thick.)

The relatively small via hole 56 of FIG. 4 is placed within a large region of potential sites on the area of contact pad 44. The real depths of the probe damaged areas 46 are not known, but the damage can and does at times go right through to the silicon or other underlying area. The aluminum in a damaged area could thus be a few angstroms thick, without anyone's knowledge. If a via 56 is placed in the approximate center of a thinned area 46 on the pad, various reliability problems can result.

A particular reliability problem is that illustrated in FIG. 5, where forming of via 56 by laser dithering, such as described in Eichelberger et al. U.S. Pat. No. 4,894,115, has actually caused a local meltback of pad 44, quite possibly in an area such as the lifted area 48 of FIG. 2. Lifted area 48, being out of contact with substrate 42, cannot dissipate in the substrate the laser energy heat generated during the laser drilling process. If processing were to continue, it would likely result in an electrical open circuit, or discontinuity, between the subsequently-applied via metallization 62 (shown in FIG. 6) and pad 44. Although this condition is recognizable by visual inspection, its repair is costly, as the standard repair procedure involves total removal of the overlying adhesive 58 and dielectric film 60, and replacement of the damaged semiconductor device 42.

Figure 6:
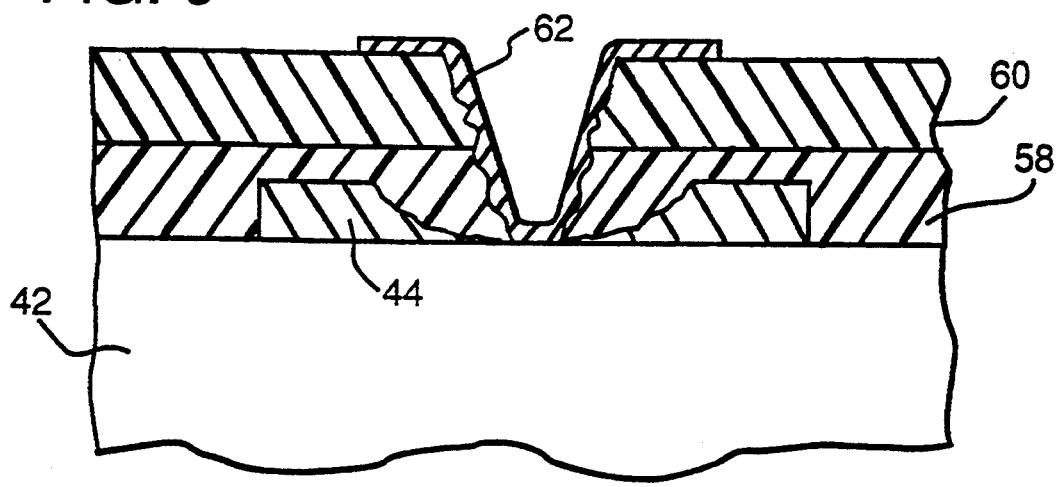
FIG. 6 depicts in cross section an HDI metallized via connected to a damaged device contact pad.

Another particular reliability problem, illustrative of a potential failure point, is depicted in FIG. 6 wherein the HDI assembly process is represented as having continued through the point of via metallization 62 in ohmic contact with what remains of contact pad 44. Due to the thinned area of pad 44 actually contacted by via metallization 62, however, current density could be many times the theoretically allowed limits, causing an electrical open circuit or discontinuity as a result of a slow electromigration or a direct burnout under surge conditions. Such failures are more likely in high radiation environments.

Generally, in processes for repair of such damaged pads, a post anneal at a temperature of about 400° C. is necessary to achieve ohmic contact and low resistivity. However, if semiconductor device 42 is included in an HDI circuit module undergoing assembly, such high temperature would destroy polymer layers 58 and 60. Moreover, the fact that damaged areas 46 are probe damaged implies that semiconductor device 42 has passed its functional and parametric tests, and reheating semiconductor device 42 to such high temperature would necessitate retesting.

The methods of the invention are facilitated by processes related to High Density Interconnect (HDI) technology, such as are disclosed in Eichelberger et al. U.S. Pat. No. 4,783,695, and related patents. The invention is particularly applicable to, but not limited to, use in the context of the manufacture of HDI assemblies. Thus, Eichelberger et al. U.S. Pat. No. 4,894,115 discloses a laser beam scanning method for forming via holes in polymer materials by direct ablation. Eichelberger et al. U.S. Pat. No. 4,714,516 discloses a method for forming via holes in a polymer film by locally predamaging the film with a laser, causing the predamaged areas to etch faster. A related technique involving a conductive layer deposited on the polymer film with an opening formed in the conductive film by laser is described in Loughran et al. U.S. Pat. No. 4,764,485. Related techniques for photopatterning resists on substrates exhibiting surface roughness are disclosed in Wojnarowski et al. U.S. Pat. Nos. 4,780,177 and 4,842,677.

It may be noted that these various laser-aided techniques contemplate accurately locating contact pads and via holes, partially by optical methods, and storing the contact pad locations in a data base for subsequently positioning and controlling the laser beam with reference to the device. Particularly in a multi-chip HDI module, there is a tolerance for variation in exact chip placement, such that the exact contact pad locations vary from one module to another. Eichelberger et al. U.S. Pat. No. 4,835,704 discloses an adaptive lithography system including techniques for determining the actual locations of chip contact pads relative to their ideal positions. This U.S. Pat. No. 4,835,704 also discloses a direct writing adaptive laser lithography system for directly exposing photoresists for forming high density interconnections on an HDI structure.

Also related to the techniques of the invention, Eichelberger et al. U.S. Pat. Nos. 4,878,991, 4,884,122 and 4,937,203 disclose techniques for disassembly and reassembly of HDI modules, whereby at least an HDI interconnection structure may be removed, and a new structure subsequently built up.

Each of the above-identified U. S. Patents is herein expressly incorporated by reference.

Referring now to FIGS. 7–15, process steps are depicted in accordance with the first overall approach of the invention for enhancing a representative contact pad 44 on semiconductor device 42. In this case, contact pad 44 has a representative damaged area 46, such as might be produced by electrical probing during testing of device 42.

Figure 7:
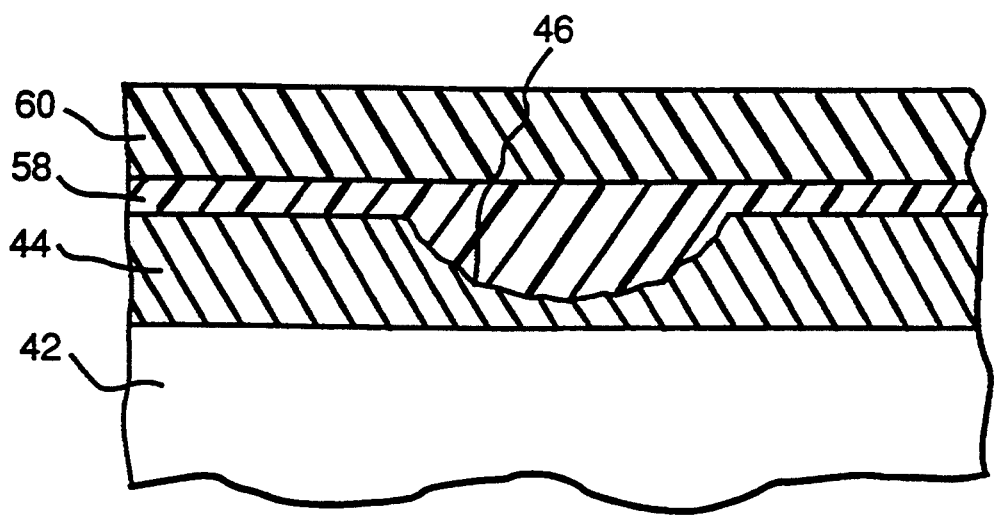
FIG. 7 depicts in cross section an initial step in accordance with an overall first approach of the invention, wherein a planarizing dielectric layer is applied over a semiconductor device surface.

The damaged area 46 in FIG. 7 is identified and located by means of a preliminary inspection step wherein the semiconductor device is visually inspected, preferably with the aid of equipment which accurately records the locations of all defects.

In FIG. 7, damaged contact pad 44 is depicted, for purposes of example, with an ULTEM adhesive layer 58 and a KAPTON dielectric film layer 60 disposed thereover. However, this is representative only, as there are several alternatives for arriving at the condition depicted in FIG. 7.

As one alternative, semiconductor device 42 and damaged contact pad 44 may comprise a portion of a wafer, an individual die or a multi-chip HDI structure, prior to application of any additional layers. In such situation, after the area of the pad which is to be enhanced has been identified, a planarizing dielectric layer is applied over the entire die or wafer area. The dielectric planarizing layer may comprise a polymer, such as a polyimide, or an inorganic material such as chemical vapor deposition (CVD) deposited glass. Thus, in FIG. 7, layers 58 and 60 represent either a single layer, or multiple layers.

Alternatively, the FIG. 7 structure may represent an initial stage of processing in accordance with HDI technology, as briefly described above, where the ULTEM adhesive layer 58 and KAPTON dielectric film 60 have been applied. Since layers 58 and 60 are transparent, it is possible to inspect for defects through these layers. Or, as depicted in FIG. 5, described hereinabove, defect 46 may initially become apparent when a via hole 56 is formed by laser drilling, whereby a lower portion 48 (as shown in FIG. 2) of the damaged pad area 46 becomes entirely vaporized.

Figure 8:
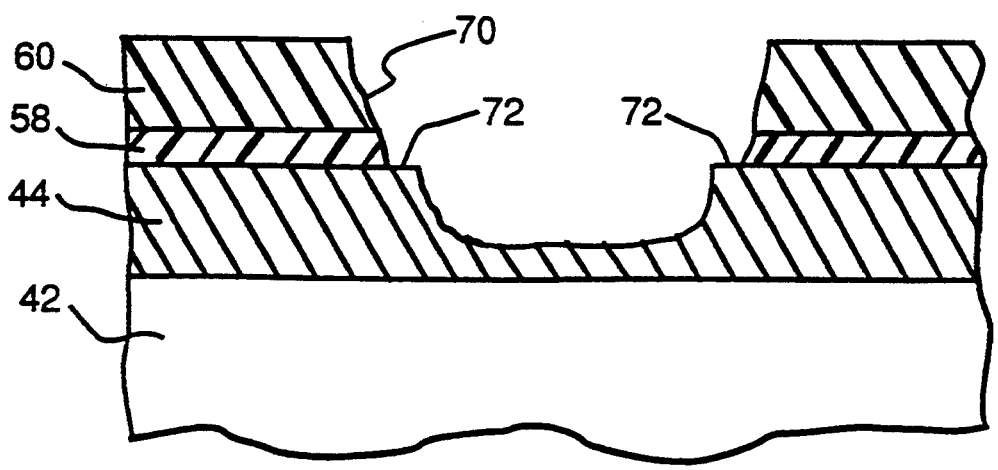
FIG. 8 depicts in cross section a step wherein an enhancement access via is opened, the via of FIG. 8 being wider at the top than at the bottom.

In any of the above circumstances, a subsequent step, as depicted in FIG. 8, is performed. This step involves forming an enhancement access via 70 in the dielectric layer or layers 58 and 60 to expose a portion 72 of contact pad 44 to be enhanced. Enhancement access via 70, which may alternatively be referred to as a repair via, is substantially larger than the normal via hole 56 for electrical connection purposes as depicted in FIG. 5. As is described hereinafter with reference to FIGS. 19 and 20, enhancement access via 70 may be larger than pad 44 itself, and may be formed by any suitable processing technique, such as any of the various techniques disclosed in the patents incorporated by reference hereinabove. A preferred technique for forming enhancement access via 70 is laser dithering to ablate dielectric material 58 and 60. Enhancement access via 70, as shown in FIG. 8, is wider at the top than at the bottom, which is characteristic of holes formed by laser ablation.

Figure 9:
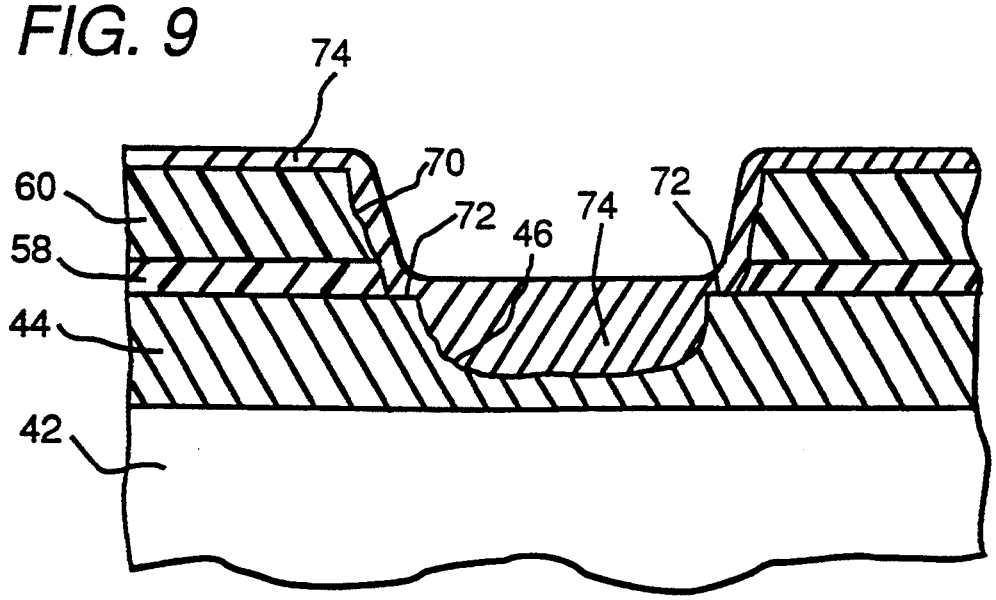
FIG. 9 depicts in cross section the results of a metallizing step.

Next, as depicted in FIG. 9, the device is metallized by applying metal 74 over dielectric layers 58 and 60, and over the portion 72 of contact pad 44 to be enhanced. More particularly, as known in the art, such metallizing step involves cleansing the device and employing conventional deposition steps, typically under vacuum conditions. Cleaning is accomplished by use of suitable solvents, etches, back sputtering, and the like. A preferable metal deposition process builds up multiple layers, commencing with application of a sputtered titanium or chromium layer to initially form a barrier layer over aluminum pad 44, followed by applying a thin sputtered copper layer, and then a more ductile electroplated copper layer. Finally, a layer of titanium may be applied over the copper to protect the copper from oxidation and related effects. Alternatively, aluminum may be employed as the enhancement or repair metal. Although metal 74 is shown as a single layer, it will be appreciated that it may comprise multiple layers as just noted.

Figure 10:
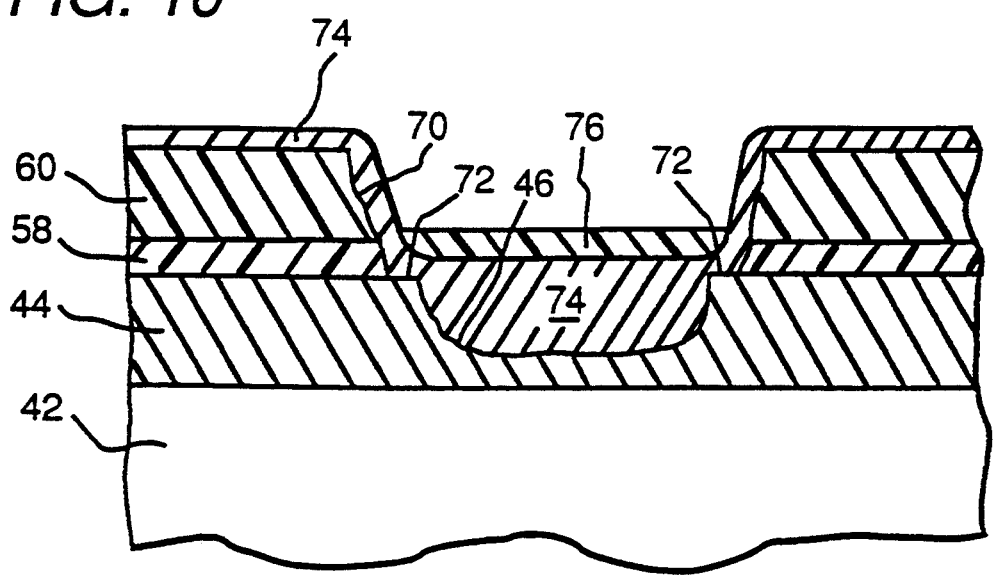
FIG. 10 illustrates in cross section the result of a masking step.

FIG. 10 depicts the next step, which involves forming a mask 76 to protect metal 74 over portion 72 of contact pad 44 which is to be enhanced. Mask 76 is conventionally formed by first applying a layer of resist material over the entire device, and then patterning and developing the resist material by means of conventional exposure techniques, resulting in the structure of FIG. 11. The computer-controlled adaptive lithography system of the above-referenced Eichelberger et al. U.S. Pat. No. 4,835,704 allows highly accurate placement of mask 76 within enhancement access via 70 as represented in FIG. 10.

Figure 11:
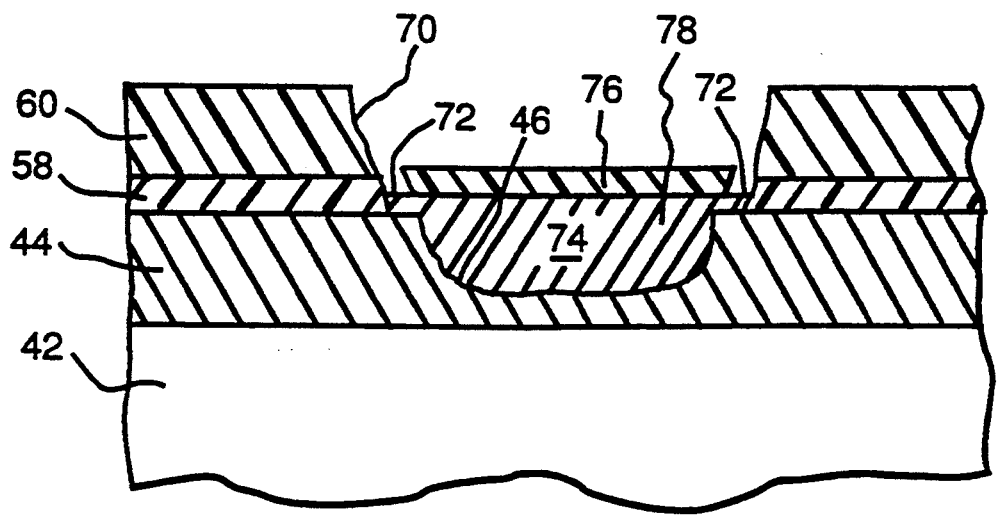
FIG. 11 illustrates in cross section the result of an etching step.

Next, as depicted in FIG. 11, metal 74 is removed by etching, except where protected by mask 76, leaving what may be described as a metal plate 78 over portion 72 of contact pad 42 which is to be enhanced. If metal 11 is aluminum, for example, it may be etched in conventional aluminum etch such as is sold by KTI Corp. of Sunnyvale, Calif. (i.e., Aluminum 1 Etch) with surfactant.

Figure 12:
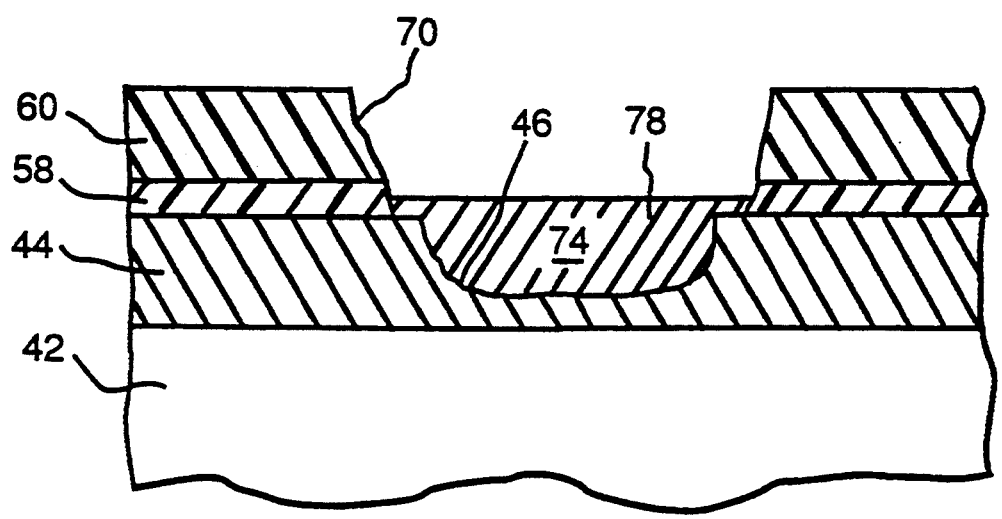
FIG. 12 illustrates in cross section the mask of FIG. 10 finally being removed.

Finally, as depicted in FIG. 12, resist mask 76 is stripped, leaving an enhanced pad 44 comprising a parallel plate 78 over defect area 46. Device 42, as depicted in the FIG. 12, is potentially ready for further processing, with defect 46 fully repaired.

In some cases, however, contact resistance between repair metal 74 and underlying aluminum pad 44 may be excessive for the application due, for example, to insufficient cleaning by back sputtering. Also, when evaporation is used to apply enhancement or repair metal 74, ohmic contact improvement is nearly always required.

In conventional semiconductor device manufacturing processes, ohmic contact is achieved by heating the entire device to a temperature sufficiently high to form an ohmic bond. The metallurgical process may be viewed as welding or what is known as sintering, whereby "spikes" of one material enter the other. However, due to both the presence of the polymer dielectric layers over the device, and due to the fact that it is undesirable to so heat a device which has already been tested, such device heating is undesirable.

Figure 13:
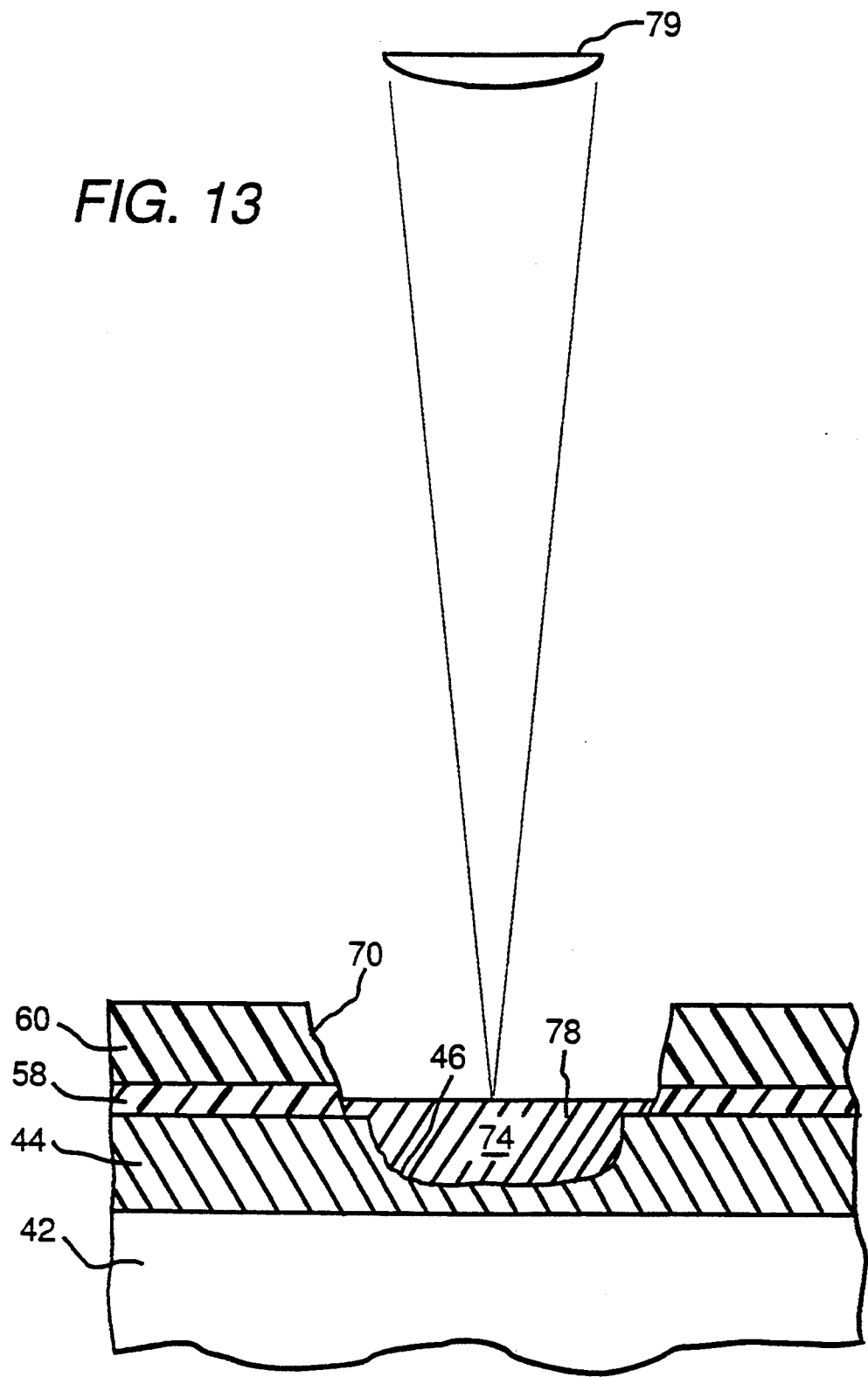
FIG. 13 schematically depicts an optional step of employing a laser to selectively heat the repair metal sufficiently to reduce contact resistance between the repair metal and the contact pad which are shown in cross section.

Accordingly, as depicted in FIG. 13, an optional step is to employ a laser 79 to selectively heat metal plate 78 including the entire metal body 74 sufficiently to reduce contact resistance between metal plate 78 and contact pad 44. Again borrowing from HDI technology as previously described, an argon ion scanning laser, operating at an appropriate wavelength to cause effective local heating, is employed to radiate the contact pad area. This is done by merely resubmitting the circuit to a laser re-drilling or re-dithering step, or a laser drill or dither step, with appropriate laser beam size and power parameters to effectuate interplate fusion or a weld sintering.

The principle of using a laser to heat a contact pad can also be used to sinter metal to semiconductor in order to make ohmic contacts or repair ohmic contacts in semiconductor wafer processing. In that event, a flow of nitrogen or other inert gas onto the wafer serves to avoid localized oxidation.

In the case of a generalized repair to a semiconductor wafer or die outside the context of HDI technology, the planarizing dielectric layer represented by layers 58 and 60 is simply removed, with the repair being complete. As previously noted, it will be appreciated that the drawing figures herein are not to scale and, for practical purposes, the slight protrusion of repair metal plate 78 above pad 44 can be ignored.

Figure 14:
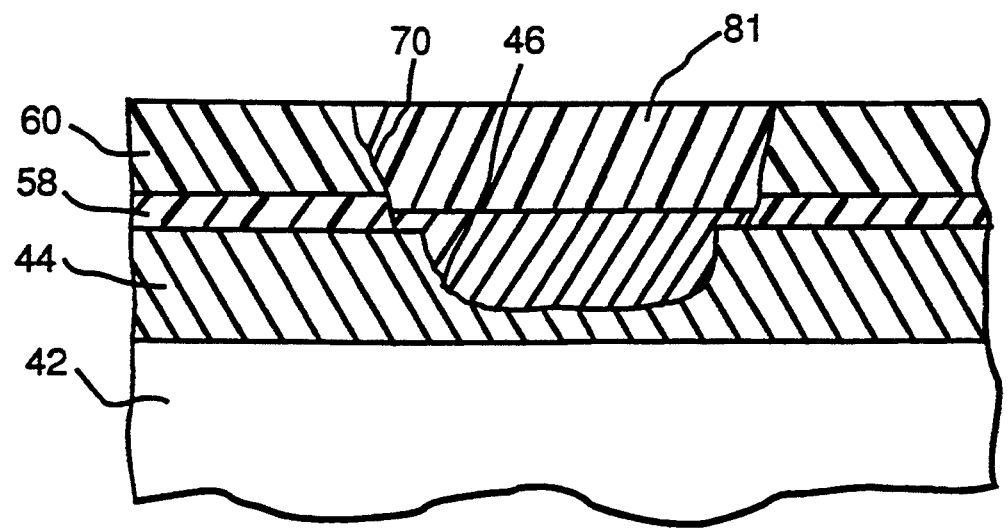
FIG. 14 depicts in cross section the repaired area backfilled with polymer, ready for further processing.
Figure 15:
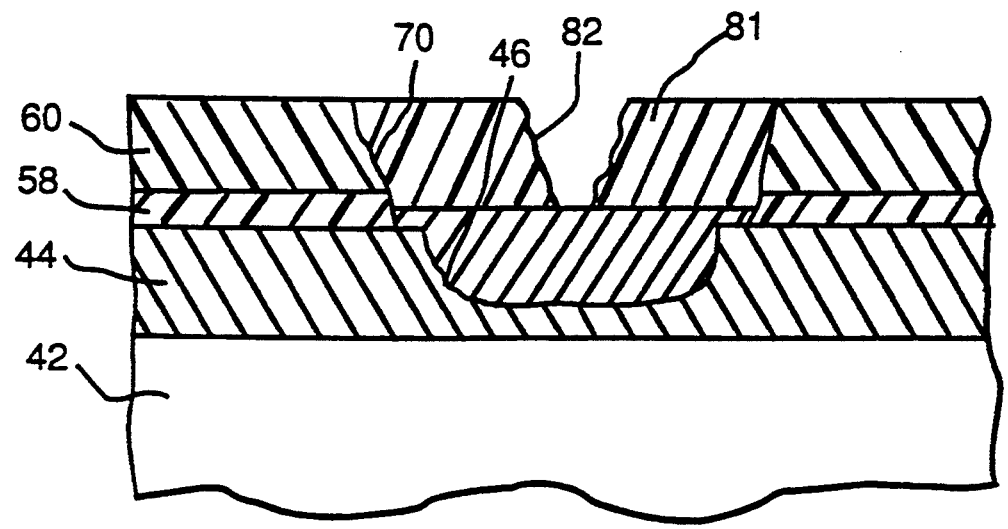
FIG. 15 depicts in cross section the repaired area of FIG. 14 with a re-dithered via in accordance with a standard HDI processing.

Alternatively, as depicted in FIGS. 14 and 15, the device may be processed as part of a multi-chip package in accordance with HDI technology. In this instance, or even in other situations where it is desired to maintain surface protection of a semiconductor device outside the context of HDI technology, enhancement access via 70 is backfilled with a suitable dielectric or polymer material 81, with a result that is essentially transparent to the repair process.

As shown in FIG. 15, a new contact via hole 82 for enabling subsequent electrical connection to contact pad 44 is laser drilled. Device 42 is now used as it would have been had it not suffered contact pad damage, and the HDI module (not shown) including the device of FIG. 15 is processed as an HDI assembly, using normal HDI process flow.

Figure 18:
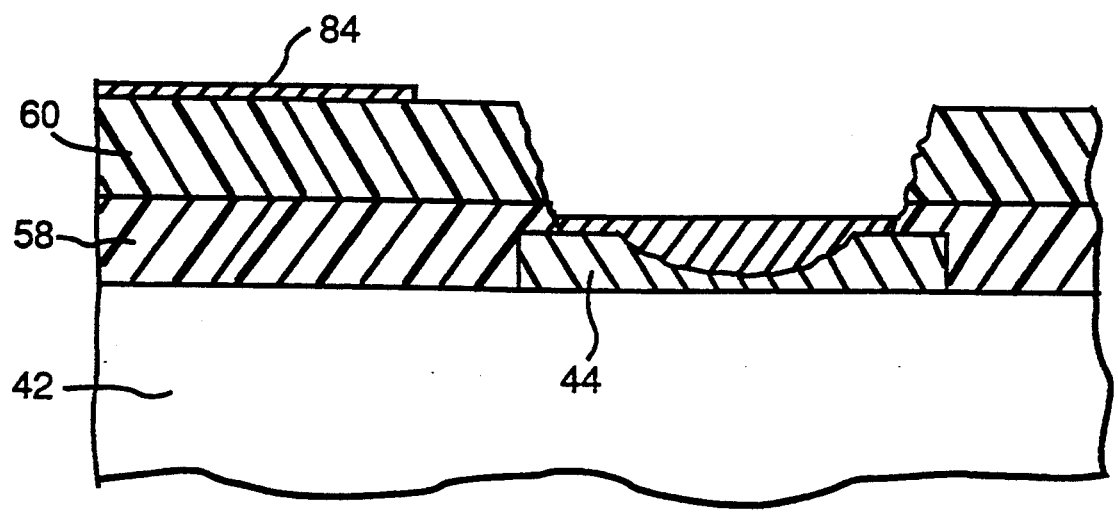
FIG. 18 depicts in cross section the result of forming the additional metal area.

As a variation in the above-described repair or enhancement process, additional metal areas, such as a metal area 84 shown in FIG. 18, may be formed over polymer film layer 60 for purposes such as providing ground planes or low-impedance power connections. Additional metal layers such as layer 84 are typically electrically isolated from the enhancement area.

Figure 16:
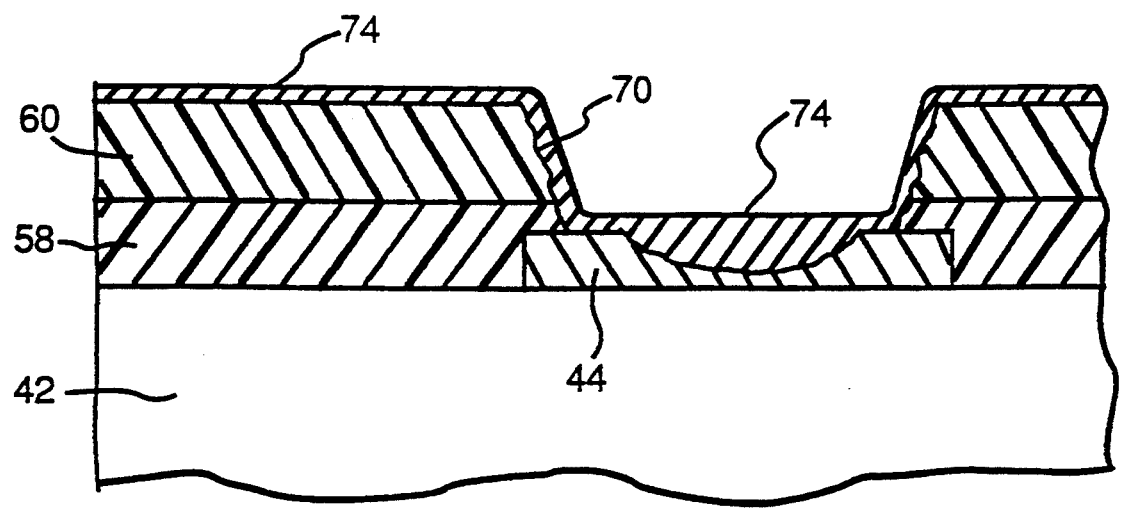
FIG. 16 (which may be compared to FIG. 9) depicts in cross section the result of a metallizing step in an embodiment where an additional metal plane is being produced.

This process variation begins with a processing step depicted in FIG. 16, which is a view comparable to FIG. 9 but showing a larger area of device 42.

Figure 17:
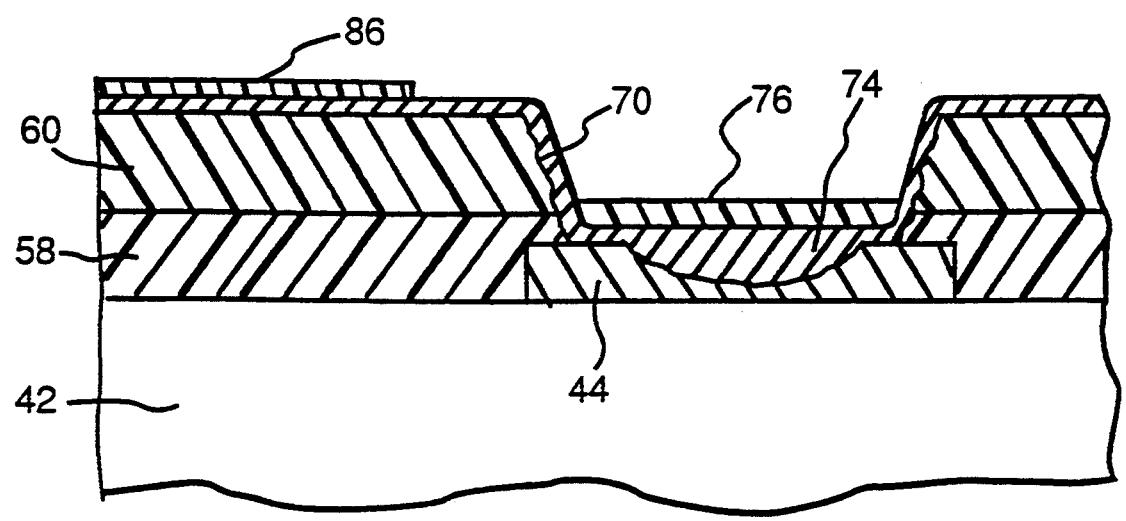
FIG. 17 depicts in cross section masking over the area of the additional metal plane.

FIG. 17 depicts mask 76, formed as in the step illustrated by FIG. 10, and an additional mask 86 formed to protect at least one additional area of metal 74. Then, as depicted in FIG. 18, the step of removing metal 74 by etching in the manner previously noted, except where the metal is protected by the mask, leaves at least one additional metal area 84.

Figure 19:
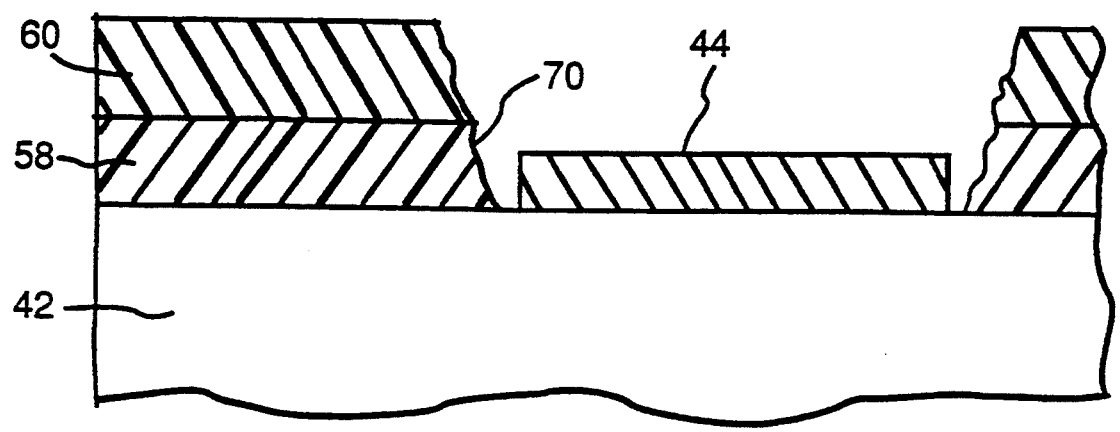
FIG. 19 depicts in cross section an embodiment wherein a contact pad is to be enlarged.
Figure 20:
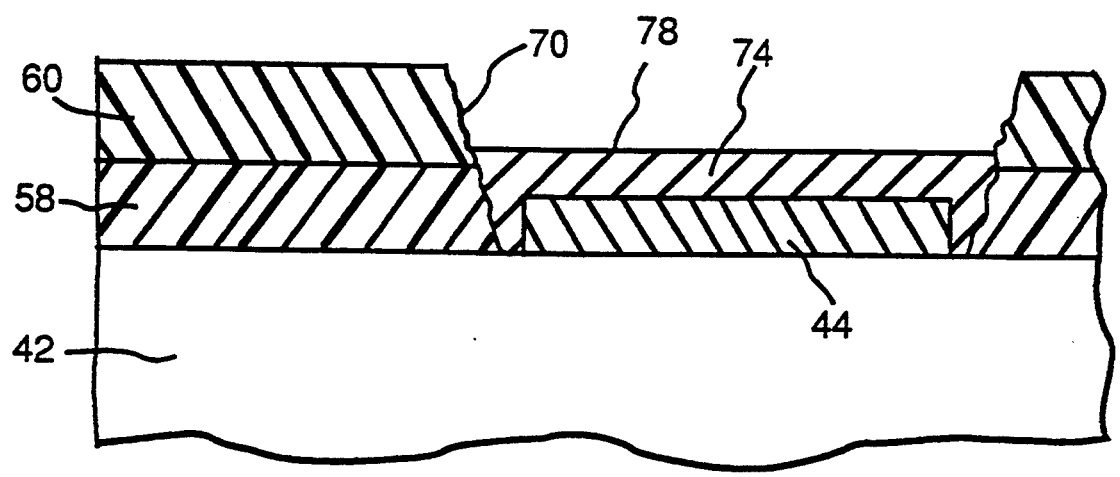
FIG. 20 depicts in cross section the enlarged contact pad resulting from the enlargement step performed on the contact pad shown in FIG. 19.

The drawing figures and description hereinabove have been directed to repairing a damaged pad. However, as shown in FIGS. 19 and 20, the invention is not limited to such repair, and the "enhancement" of the pad may comprise enlarging the pad. Thus as shown in FIG. 19, pad 44 is representative of a small pad or a VLSI circuit node which, if enlarged, can readily be probed normally with conventional technology.

The enhancement process is substantially the same as described hereinabove, except that enhancement access via 70 is larger than pad 44 and pad 44 does not necessarily include a defect (although it may, of course). In this situation, the portion of contact pad 44 to be enhanced comprises the entire contact pad.

FIG. 20 depicts the results of the processing steps as just described, performed on the device of FIG. 19. These results are comparable to those illustrated in FIG. 12, except that metal area 74 is much larger than in the device of FIG. 12.

The remaining FIGS. 21-35 depict process steps in accordance with the second overall approach of the invention, in what may be viewed as re-entrant hole embodiments. There are, in turn, a number of variations in the re-entrant hole embodiments.

Figure 21:
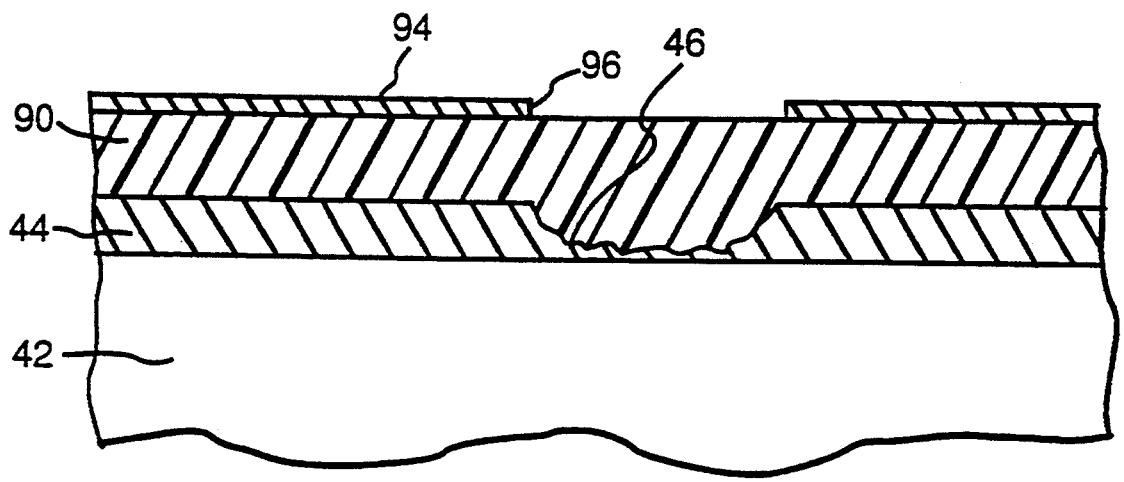
FIG. 21 depicts in cross section an initial step of an overall second approach of the invention (a form of the re-entrant hole embodiment) wherein a metal mask is employed for re-entrant hole formation.

FIG. 21 shows, as an initial step, a layer 90 of resist material applied over the semiconductor device surface including pad 44 with its damaged area 46. The layer of resist material 90 may comprise either a conventional photoresist, or a polymer material, the latter being better able to withstand process metallizing heat cycles than is a photoresist. In either event, resist material 90 is applied over the entire wafer, die or nonlaminated multi-chip HDI structure, or other wafer scale integration or hybrid array device, to totally coat the semiconductor and pad surfaces. Examples of suitable resist and polymer materials are Fanton 360 by Chemline Industries of Carson city, Nev.; Riston laminar resist by E. I. de Pont de Nemours and Co.; polymethyl methacrylate (PMMA), and ULTEM polyethermide.

An alternative way of applying resist is to use an upper layer 94 of dissimilar materials, such as a metal, ceramic or different organic film in conjunction with the metal or ceramic. For example, layer 94 may be applied by conventional sputtering of titanium and copper or titanium and nickel, and an opening 96 is aligned with the damaged pad area formed beneath it by adaptive laser lithography etching or laser ablation.

Figure 22:
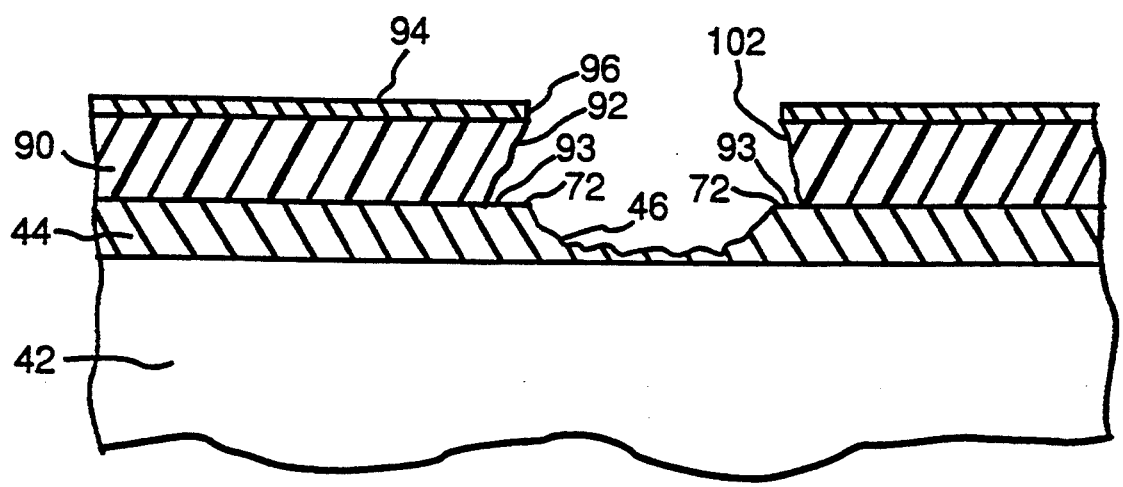
FIG. 22 depicts in cross section a re-entrant hole formed by a plasma ashing.

Next, as shown in FIG. 22, an enhancement access via 92 of re-entrant hole shape is formed in the layer of resist material 90. Enhancement access via 92 is termed "re-entrant" because it is wider at the bottom than at the top, an inherent characteristic of plasma barrel etchers. The invention, however, is not limited to use of plasma barrel etching. A variety of techniques are known for forming such re-entrant holes, such as reactive ion etching (RIE), electron cyclotron resonance (ECR) etching, or certain wet etch processes which will not attack the upper masking layer.

Re-entrant enhancement access via 92 exposes not only portion 72 of contact pad 44 to be enhanced, but also a larger region 93 of contact pad 44 (or device 42 surface 40) including the portion 72 to be enhanced.

As an alternative to reduce heating that is attendant to etching by plasma ashing, an Excimer laser aided by an aluminum mask can be employed to pre-etch via holes 92. In this alternative, a reflective nonablatable mask is formed, and openings are patterned therein. An Excimer laser operating at a wavelength of 308 nm or 248 nm, for example, etches or ablates polymer material readily. The subsequent plasma ashing time to form the re-entrant hole shape is greatly shortened. As a related alternative, the laser dither method of the above-incorporated Eichelberger et al. U.S. Pat. No. 4,894,115 can be employed to dig out polymer in the desired enhancement access via areas, followed by plasma ashing.

Figure 23:
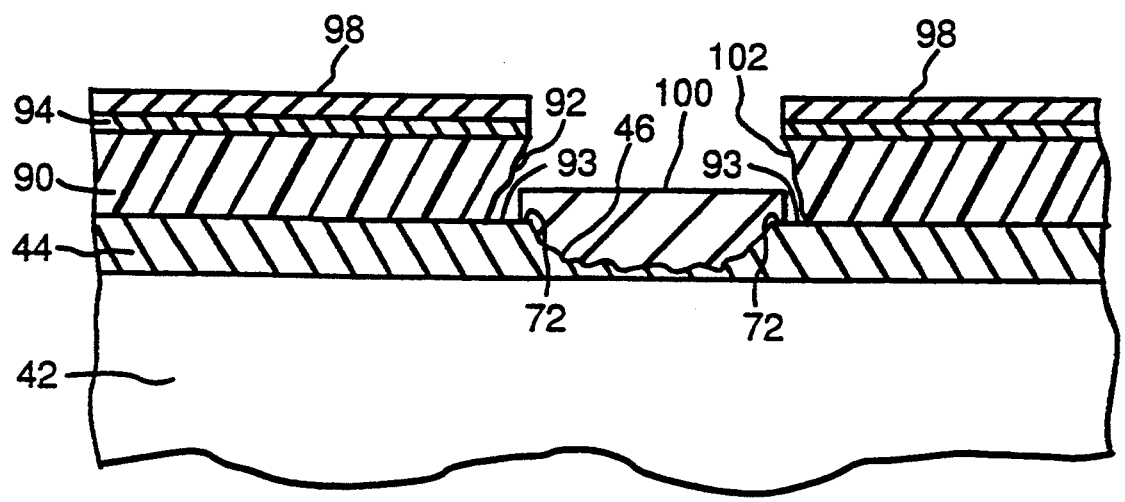
FIG. 23 depicts in cross section a repair to the damaged via area with a discontinuity in the applied metal.

Next, as depicted in FIG. 23, the device is metallized by applying metal over the top of resist layer 90, which coats metal mask layer 94 with a metal layer 98 and forms a repair metal layer 100 over portion 72 of contact pad 44 to be enhanced. As a result of the shape of re-entrant enhancement access via 92, which in effect provides an overhang 102, there is a discontinuity between metal 98 over the layer of resist material 90 and metal 100 over the portion of the contact pad to be enhanced. Thus there is a blind spot under overhang 102 in an annular portion of exposed region 93 not including enhanced portion 72.

Preferably, electron beam evaporation is employed in applying metal 98 and 100, starting with a barrier layer of titanium or chromium, with additional layers built up as desired. The additional layers can alternatively even comprise aluminum. When evaporation is used as the metal deposition technique, generally a line of sight coverage is realized.

Figure 24:
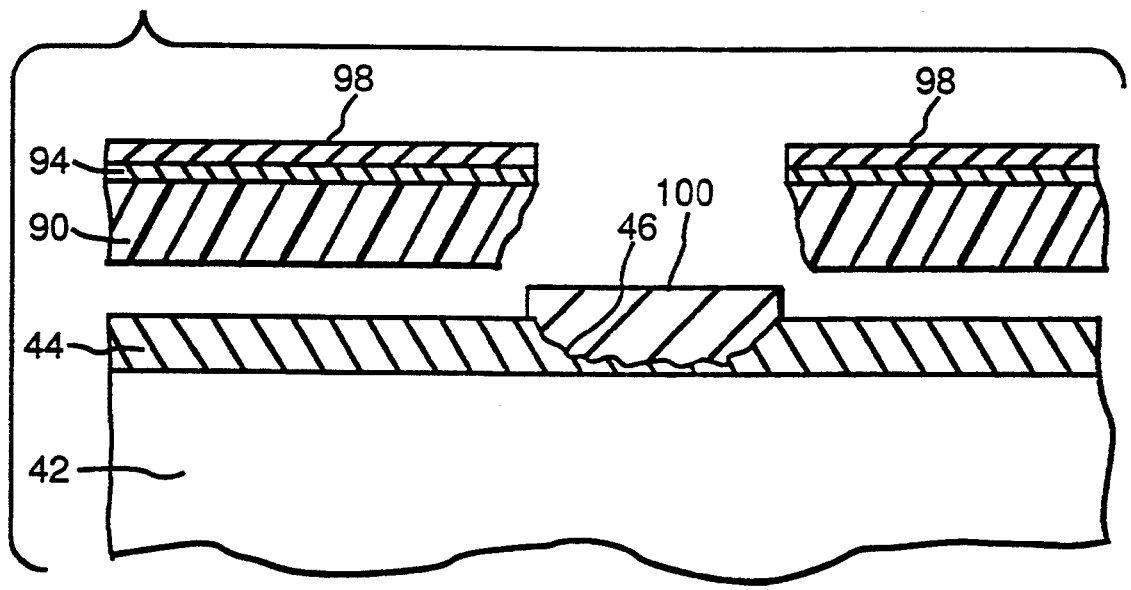
FIG. 24 depicts in exploded cross section solvent dissolution of the resist region, enabling the added metal to float off.

Finally, at least metal 98 over the layer of resist material 90 is removed, while leaving metal 100 over contact pad 44. There are two overall alternatives for removing metal 98. One alternative, represented in FIG. 24, is simply to directly dissolve layer 90 of resist material to allow all the upper layers to "float off" as illustrated. Due to the discontinuity between metal 98 and metal 100 caused by overhang 102 of re-entrant enhancement access via 92, the etchant has access to attack resist layer 90, undermining upper layers 94 and 98. In the case of a PMMA polymer resist 90, acetone or a number of other simple solvents may be employed to "float off" the upper layers as shown.

Figure 25:
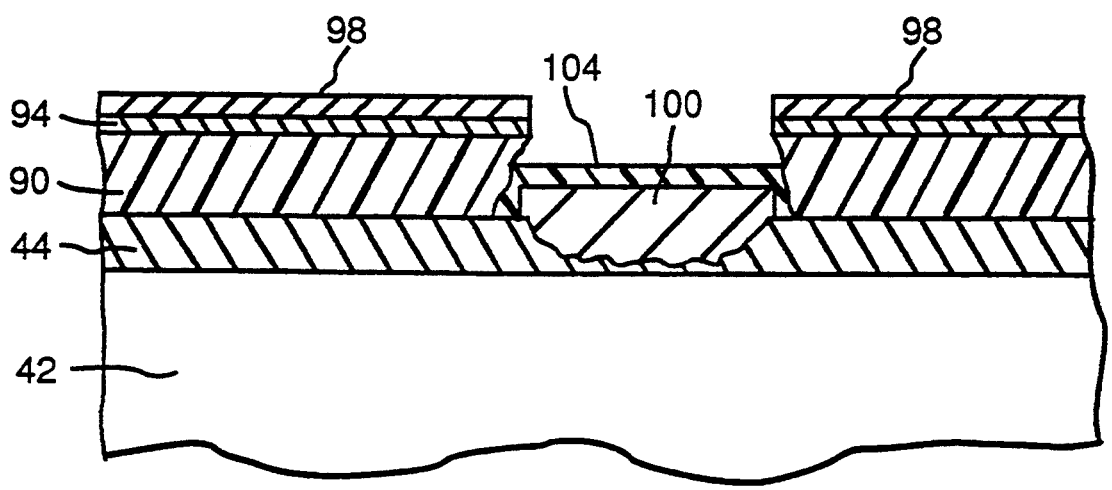
FIG. 25 depicts in cross section a process alternative wherein photoresist is applied on the pad area for protection to permit subsequent excess metal removal by chemical etching.

FIG. 25 depicts an approach which may be employed either as the second alternative for removing at least metal 98 over the layer of resist material, or as an aid to the "float off" technique. In particular, a layer of resist 104 is shown in FIG. 25 as having been applied and patterned to leave resist over repair metal 100 and contact pad metal 44.

Figure 26:
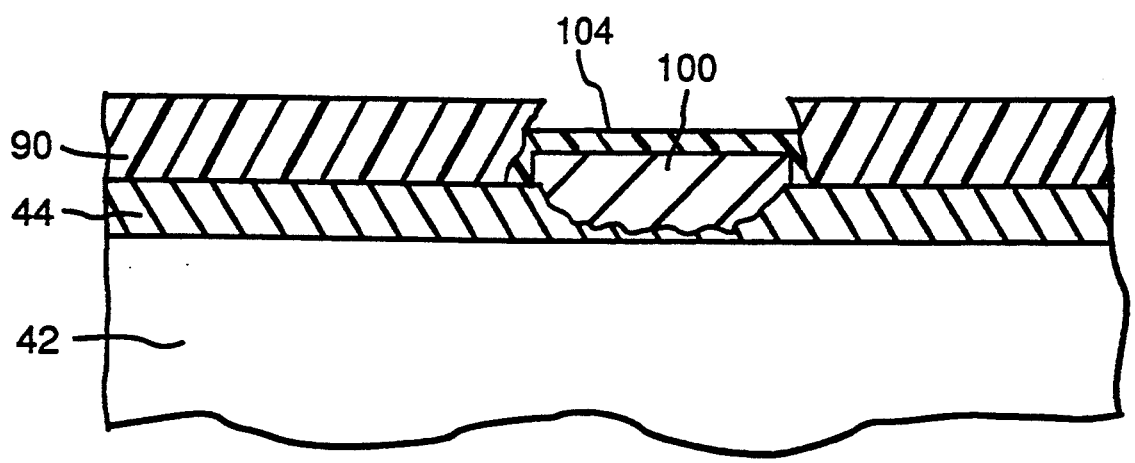
FIG. 26 depicts a subsequent step where metals have been removed by chemical etches.

The upper metal layers 94 and 98 are then removed by employing a suitable etching technique such as provided by an appropriate chemical solution capable of etching titanium, chromium or aluminum as required, depicted in FIG. 26. Chromium may be etched by a chrome etch solution of nitric acid, cerric ammonium nitrate, and acetic acid, available from Transene Corp. of Rawley, Mass. Titanium may be etched in a TFT solution comprised of 1 part TFT, available from Transene Corp., and 10 parts water, and aluminum may be etched in commercial aluminum pad etch for semiconductors.

Figure 27:
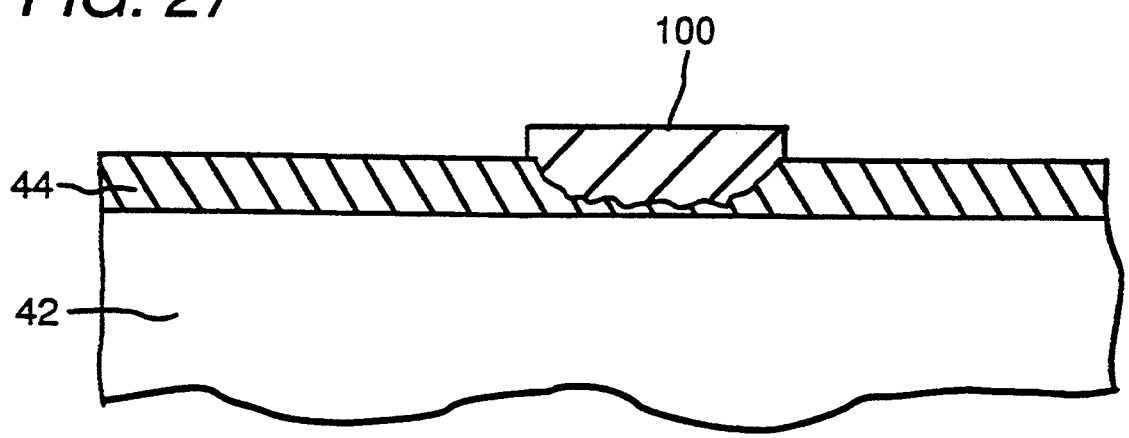
FIG. 27 depicts in cross section a re-entrant hole repair wherein the polymer resist layers have been removed by chemical etches.

Finally, as depicted in FIG. 27, resist layers 90 and 104 shown in FIGS. 25 and 26 are stripped by a suitable selective etch process, such as plasma barrel etching with oxygen, leaving only repair area 100.

Figure 28:
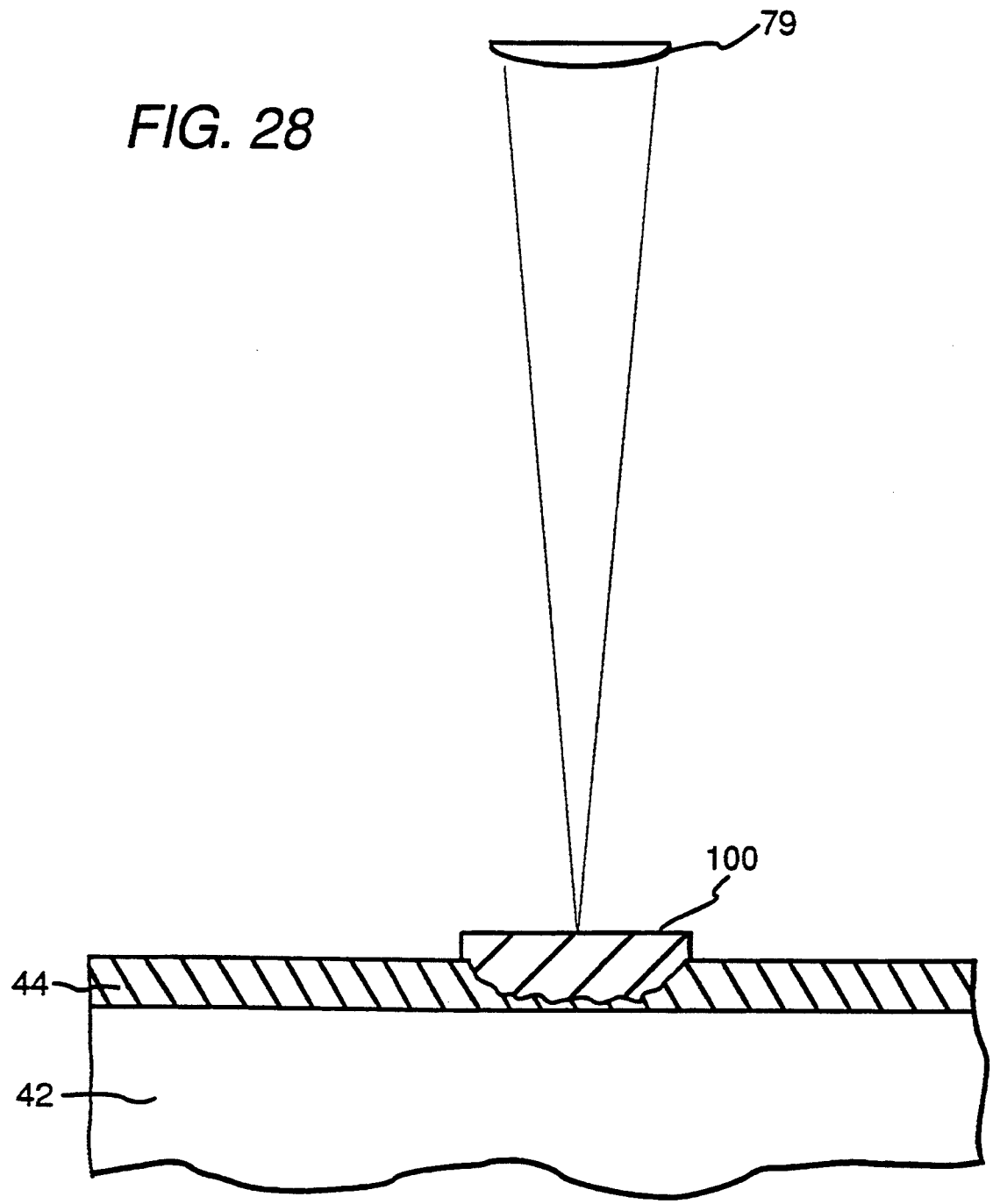
FIG. 28 schematically depicts laser weld/sintering of a re-entrant pad repair.

As discussed hereinabove with reference to FIG. 13, particularly where evaporation is employed to deposit the repair metal, ohmic contact improvement is nearly always required. Thus, as shown in FIG. 28, a scanning laser 79 is used to selectively heat metal 100 over contact pad 44 to reduce contact resistance between the metal and contact pad 44, without excessively heating the entire device, in a manner similar to that described hereinabove with reference to FIG. 13.

Figure 29:
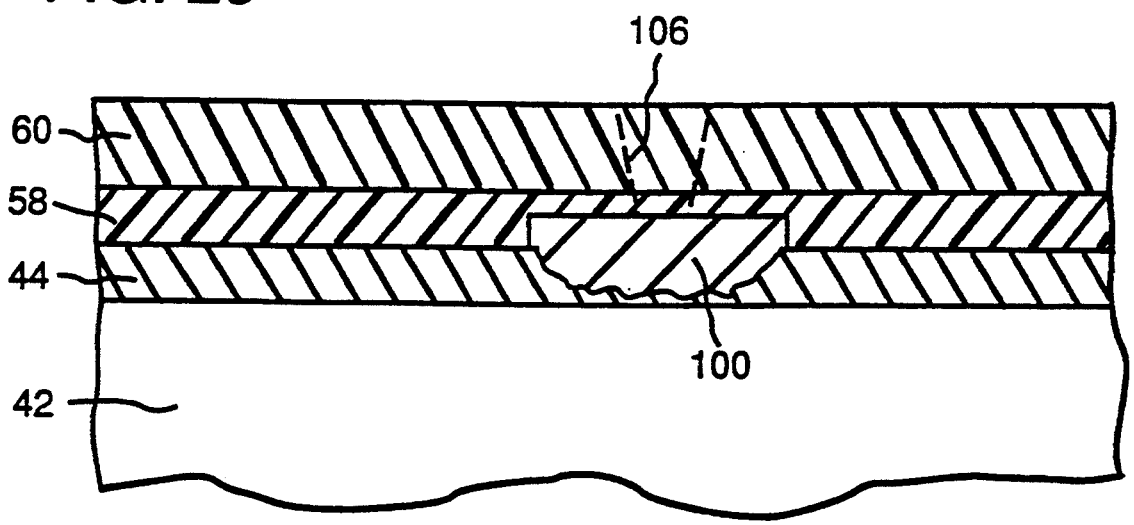
FIG. 29 illustrates in cross section re-lamination of a re-entrant hole repair, with a proposed via hole shown.

FIG. 29, applicable to the specific case of HDI technology, represents the finished repair of a damaged pad by use of the re-entrant hole embodiment, with subsequent lamination by an ULTEM adhesive layer 58 and a KAPTON polymer film layer 60. The location of a proposed via 106 to be subsequently formed by laser dithering is indicated by dashed lines. It will be apparent, therefore, that the repaired device is fully ready for reinsertion into the normal HDI process.

FIGS. 30–35 illustrate a variation of the processes of FIGS. 21–26, wherein the layer of resist material 90 is a photoresist, and the unique attributes of laser adaptive lithography techniques of HDI, such as disclosed in the above-incorporated Eichelberger et al. U.S. Pat. No. 4,835,704, are employed. In this process, exact pad positions are learned by use of a measure program on the HDI laser system noted above. This system stores, for exposure purposes, pad positions for exposure and dithering of holes. These positions are unique for each circuit, due to minute changes in relative die positions after attachment in accordance with HDI adaptive lithography technology.

Figure 30:
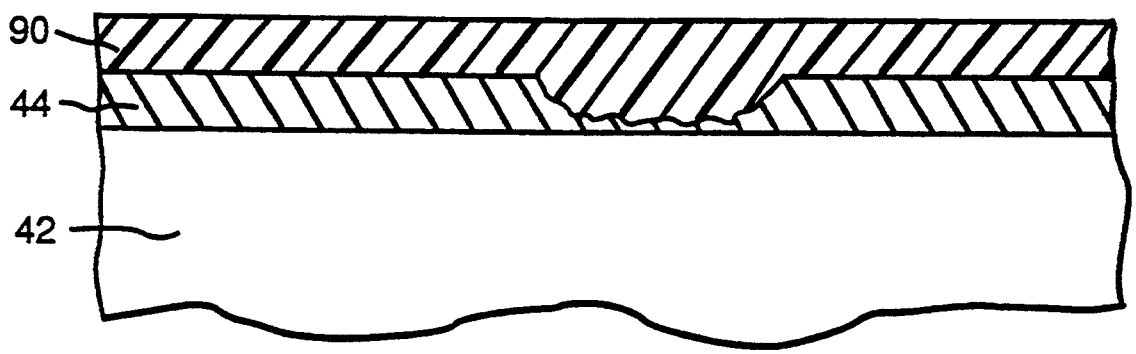
FIG. 30 illustrates in cross section an initial process step where a re-entrant hole is to be formed without employing a metal mask.

FIG. 30 is similar to FIG. 21, except that mask 94 of FIG. 21 is not employed. In FIG. 30 the layer of resist 90 is preferably a photoresist, such as Hoechst AZ 5214 or AZ 5218, which are image reversal types of photoresist capable of acting in the positive or negative mode depending on the exposure and post exposure bake conditions.

Figure 31:
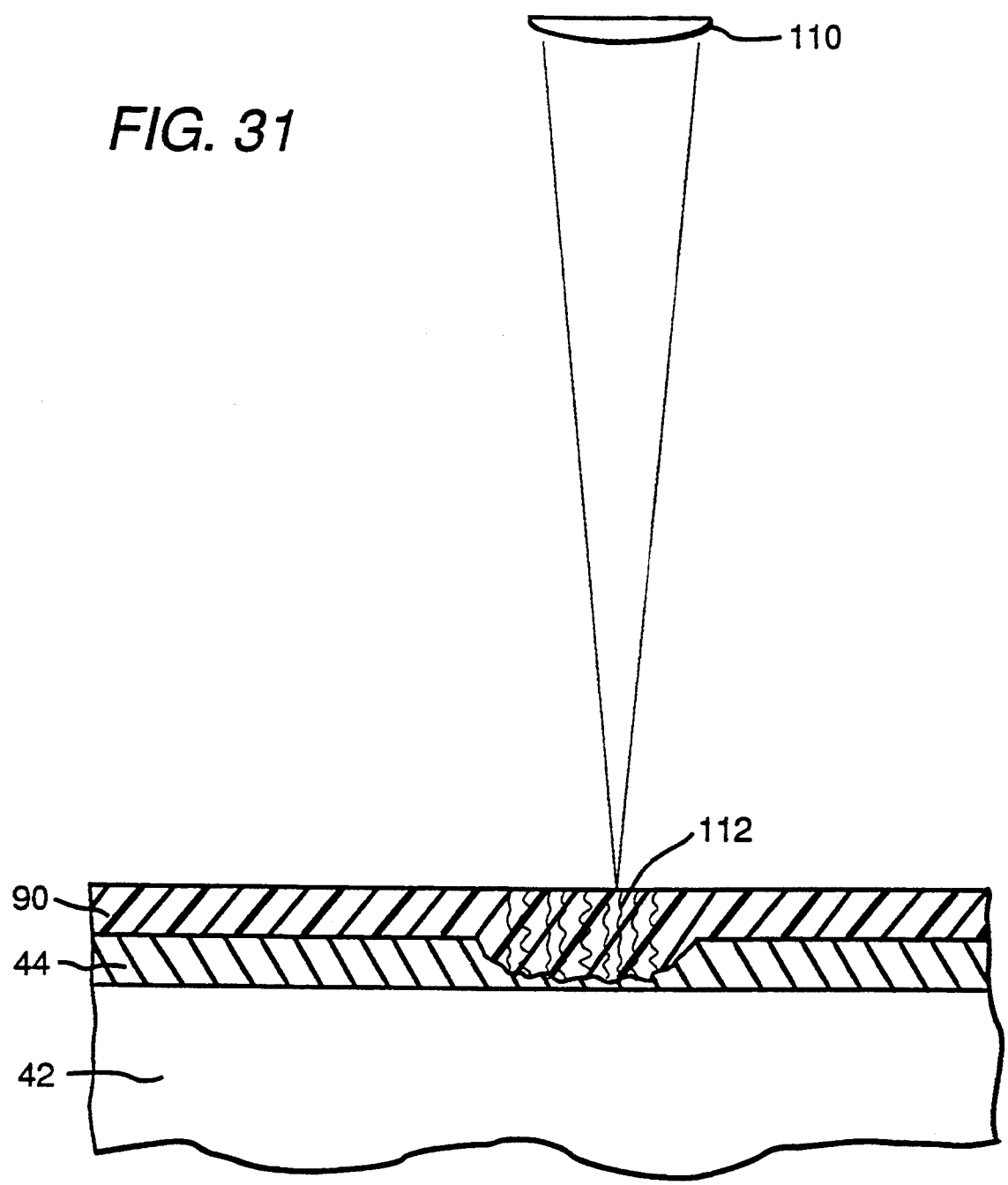
FIG. 31 schematically illustrates employment of a laser to selectively expose a photoresist layer.

As indicated in FIG. 31, the layer of photoresist material 90 is directly exposed by a laser 110. Photoresist material 90 is then given a post exposure bake followed by a flood exposure. The exposed region of the photoresist is designated 112 in FIG. 31.

Figure 32:
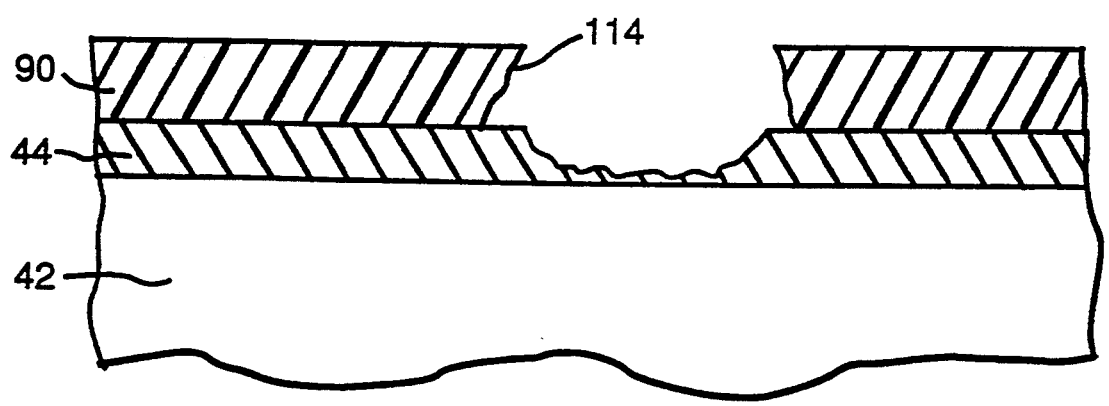
FIG. 32 illustrates in cross section the results of a subsequent step of developing the photoresist.

Next, as shown in FIG. 32, the exposed photoresist portion 112 is developed, to yield a re-entrant access via 114.

Figure 33:
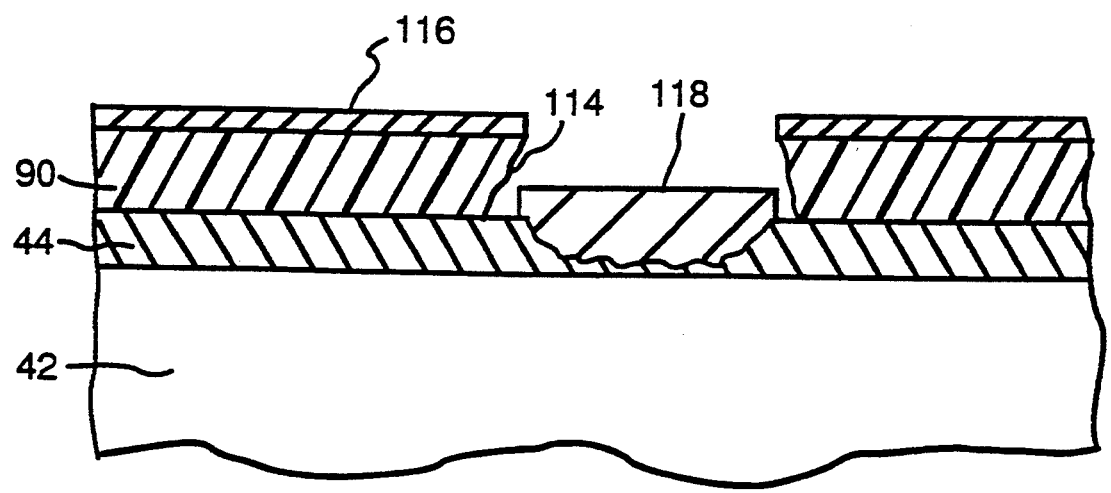
FIG. 33 illustrates in cross section metallizing over resist only, to create a pad repair.

Next, as shown in FIG. 33, the device is metallized by applying metal over the device to form a metal layer 116 over resist layer 90 and a metal layer 118 over contact pad 44. The metallization is produced by electron beam evaporation, starting with a barrier layer of titanium or chromium, and with additional layers built up as desired. The additional layers can, if desired, even comprise aluminum. The metallization results in a discontinuity between metal layers 116 and 118 caused by the overhang of photoresist 90 at the narrower top of the via hole.

Figure 34:
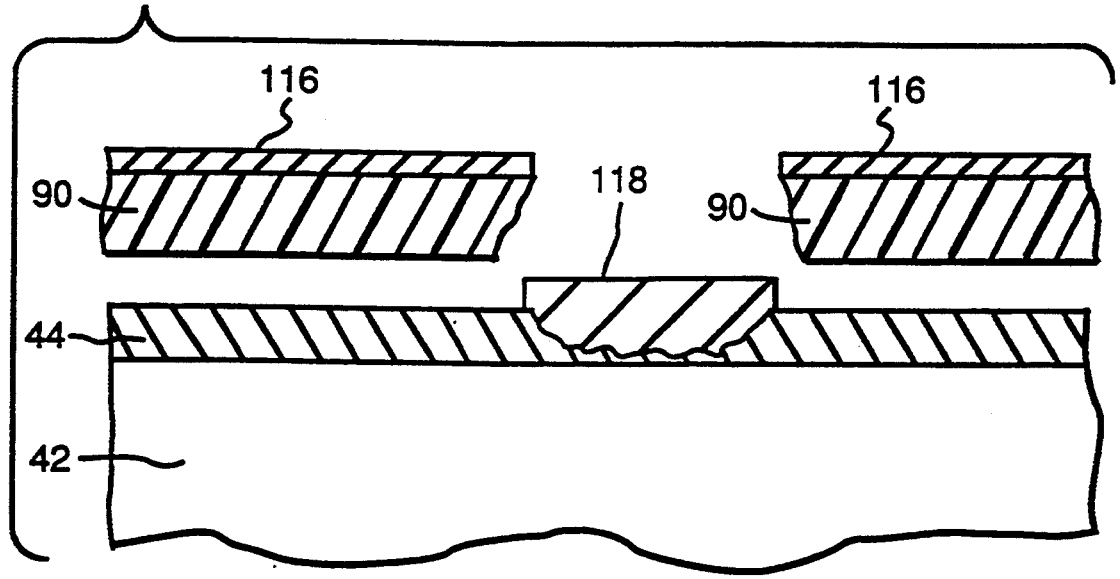
FIG. 34 illustrates in exploded cross section resist dissolution resulting in metal float-off.

As indicated in FIG. 34, the entire upper structure may, at this juncture, be "floated off" by dissolving resist layer 90. When layer 90 "floats off", it carries with it upper metal layer 116. If photoresist layer 90 comprises AZ 5214 or other similar acting photoresist, acetone or other solvents may be employed to "float off" the upper layers as shown.

Figure 35:
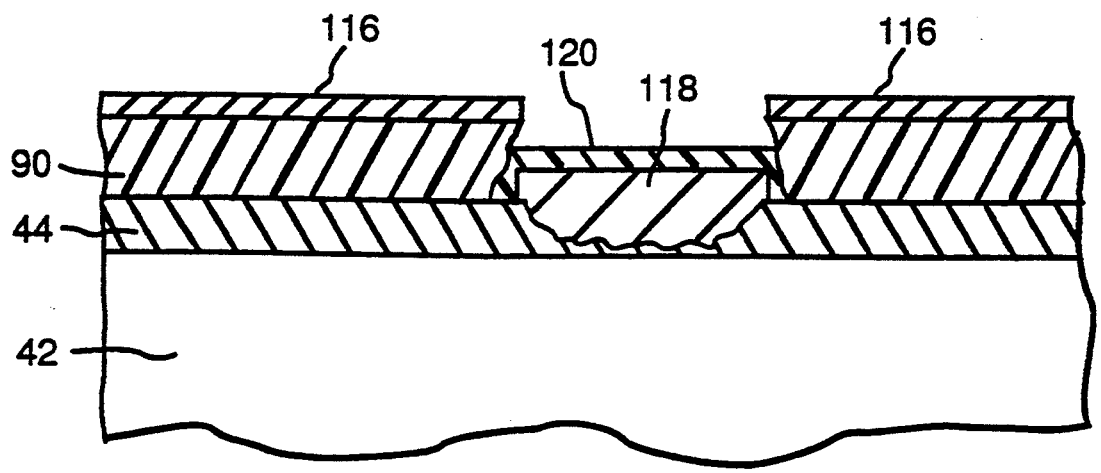
FIG. 35 illustrates in cross section an alternative process of protecting pad areas.

Alternatively, as depicted in FIG. 35, a protective resist layer 120 may be applied in a manner similar to that described for resist 104 shown in FIG. 25, with processing then continuing in a manner similar to that described in conjunction with FIGS. 26–29, above.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for enhancing a contact pad on a surface of a semiconductor device, comprising:

applying a layer of resist material over the semiconductor device surface and over the contact pad;

forming in the layer of resist material an enhancement access vial of re-entrant hole shape which is wider at the bottom than at the top, to expose a region of the contact pad including a portion of the contact pad to be enhanced;

metallizing the region of the contact pad to be enhanced by applying metal over both the layer of resist material and the exposed portion of the contact pad, while leaving a discontinuity between the metal over the layer of resist material and the metal over the portion of the contact pad to be enhanced; and removing the metal over the layer of resist material, without removing the metal over the region of the contact pad to be enhanced.

2. The method of claim 1, which further comprises the step of employing a laser to selectively heat the metal over the region of the contact pad to be enhanced, to reduce contact resistance between the metal and the contact pad.

3. The method of claim 1, wherein the layer of resist material comprises a photoresist.

4. The method of claim 1, wherein the layer of resist material comprises a polymer.

5. The method of claim 1, wherein the step of metallizing is performed by evaporating metal.

6. The method of claim 1, wherein the step of forming an enhancement access via of re-entrant hole shape comprises the steps of:
- depositing a metal mask layer over the layer of resist material;
- forming an opening in the metal mask layer; and
- plasma ashing to etch the resist material through the opening in the metal mask layer.

7. The method of claim 1, wherein the resist material is a photoresist material and the step of forming an enhancement access via of re-entrant hole shape comprises the substeps of:
- selectively exposing the photoresist material to laser energy in a location where the enhancement access via is to be located; and
- developing the layer of photoresist material.

8. The method of claim 1, wherein the step of forming an enhancement access via of re-entrant hole shape comprises the steps of:
- employing a laser to pre-etch the resist material by ablation, where the enhancement access hole is to be formed; and
- plasma ashing to define a re-entrant hole shape.

9. The method of claim 1, wherein the step of removing the metal over the layer of resist material, without removing the metal over the region of the contact pad, comprises the steps of:
- applying a resist coating on the metal over the portion of the contact pad;
- etching to remove the metal over the layer of resist material; and
- removing the resist coating on the metal over the portion of the contact pad.

10. The method of claim 1, wherein the step of removing the metal over the layer of resist material, without removing the metal over the region of the contact pad, further comprises the step of etching to remove the layer of resist material.

11. The method of claim 1, wherein the step of removing the metal over the layer of resist material, without removing the metal over the region of the contact pad, comprises the steps of: etching to dissolve the layer of resist material so as to undermine the metal over the layer of resist material; and
- allowing the metal over the layer of resist material to float off.

* * * * *